(12) United States Patent
Oh

(10) Patent No.: US 11,003,392 B2
(45) Date of Patent: May 11, 2021

(54) MEMORY CONTROLLER AND METHOD OF OPERATING THE MEMORY CONTROLLER

(71) Applicant: SK hynix Inc., Icheon-si (KR)

(72) Inventor: Young Chan Oh, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 20 days.

(21) Appl. No.: 16/672,087

(22) Filed: Nov. 1, 2019

(65) Prior Publication Data

US 2020/0379679 A1    Dec. 3, 2020

(30) Foreign Application Priority Data

May 28, 2019   (KR) .......................... 10-2019-0062691

(51) Int. Cl.
*G11C 7/00* (2006.01)
*G06F 3/06* (2006.01)
*G11C 16/30* (2006.01)
*G11C 5/14* (2006.01)
*G11C 16/20* (2006.01)
*G11C 16/22* (2006.01)
*G11C 16/04* (2006.01)

(52) U.S. Cl.
CPC .......... *G06F 3/0659* (2013.01); *G06F 3/0604* (2013.01); *G06F 3/065* (2013.01); *G06F 3/0673* (2013.01); *G11C 5/148* (2013.01); *G11C 16/20* (2013.01); *G11C 16/225* (2013.01); *G11C 16/30* (2013.01); *G11C 16/0483* (2013.01)

(58) Field of Classification Search
CPC ...................................................... G11C 5/148
USPC ........................................................ 365/226
See application file for complete search history.

(56) References Cited

U.S. PATENT DOCUMENTS

2016/0266199 A1 *   9/2016   Kurosawa .............. G11C 5/147

FOREIGN PATENT DOCUMENTS

KR   1020140131185 A   11/2014
KR   1020160074253 A   6/2016

* cited by examiner

*Primary Examiner* — Hoai V Ho
(74) *Attorney, Agent, or Firm* — William Park & Associates Ltd.

(57) ABSTRACT

Provided herein may be a memory controller configured to control a memory device for storing data. The memory controller may include: a voltage sensor configured to detect whether a level of a power supply voltage to be applied to the memory device and the memory controller is equal to or less than a reference level, and generate detect information; and a power controller configured to receive the detect information and output, to the memory device, a power supply voltage reset command for resetting the power supply voltage to be applied to the memory device, wherein the reference level is greater than the voltage level for initiating reset of the memory device and the memory controller and less than the voltage level required for the memory device and the memory controller to perform an operation.

20 Claims, 17 Drawing Sheets

| 1 | CMD1 |
| 2 | DATA1 |
| 3 | CMD2 |
| 4 | CMD3 |
| 5 | DATA3 |
| 6 | CMD4 |

MEMORY CONTROLLER AND METHOD OF OPERATING THE MEMORY CONTROLLER

CROSS-REFERENCE TO RELATED APPLICATION

The present application claims priority under 35 U.S.C. § 119(a) to Korean patent application number 10-2019-0062691, filed on May 28, 2019, in the Korean Intellectual Property Office, the entire disclosure of which is incorporated herein by reference.

BACKGROUND

1. Technical Field

Various embodiments of the present disclosure generally relate to an electronic device, and more particularly, to a memory controller and a method of operating the memory controller.

2. Related Art

Generally, a storage device is a device which stores data under control of a host device such as a computer, a smartphone, or a smartpad. According to the type of device provided to store data, examples of the storage device may be classified into a device such as a hard disk drive (HDD) which stores data in a magnetic disk, and a device such as a solid state drive (SSD) or a memory card which stores data in a semiconductor memory, particularly, a nonvolatile memory.

The storage device may include a memory device in which data is stored, and a memory controller configured to store data in the memory device. Memory devices may be classified into volatile memories and nonvolatile memories. Representative examples of the nonvolatile memories may include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc.

SUMMARY

An embodiment of the present disclosure may provide for a memory controller configured to control a memory device for storing data, the memory controller including: a data transmitter configured to receive a request and data from a host, and output the data and a command corresponding to the request to the memory device; a voltage sensor configured to detect whether a level of a power supply voltage to be applied to the memory device and the memory controller is equal to or less than a reference level, and generate detect information; a data backup component configured to store backup data based on the detect information; and a power supply controller configured to output, to the memory device, a power supply voltage reset command for resetting the power supply voltage to be applied to the memory device based on the detect information, wherein the reference level is greater than the voltage level for initiating reset of the memory device and the memory controller and less than the voltage level required for the memory device and the memory controller to perform an operation.

An embodiment of the present disclosure may provide for a method of operating a memory controller configured to control a memory device for storing data, the method including: receiving a request and data from a host, and outputting the data and a command corresponding to the request to the memory device; detecting whether a level of a power supply voltage to be applied to the memory device and the memory controller is equal to or less than a reference level, and generating detect information; storing backup data based on the detect information; and outputting, to the memory device, a power supply voltage reset command for resetting the power supply voltage to be applied to the memory device based on the detect information, the reference level is greater than the voltage level for initiating reset of the memory device and the memory controller and less than the voltage level required for the memory device and the memory controller to perform an operation.

An embodiment of the present disclosure may provide for a memory controller configured to control a memory device for storing data, the memory controller including: a voltage sensor configured to detect whether a level of a power supply voltage to be applied to the memory device and the memory controller is equal to or less than a reference level, and generate detect information; and a power controller configured to receive the detect information and output, to the memory device, a power supply voltage reset command for resetting the power supply voltage to be applied to the memory device, wherein the reference level is greater than the voltage level for initiating reset of the memory device and the memory controller and less than the voltage level required for the memory device and the memory controller to perform an operation.

DETAILED DESCRIPTION

Figure 1:
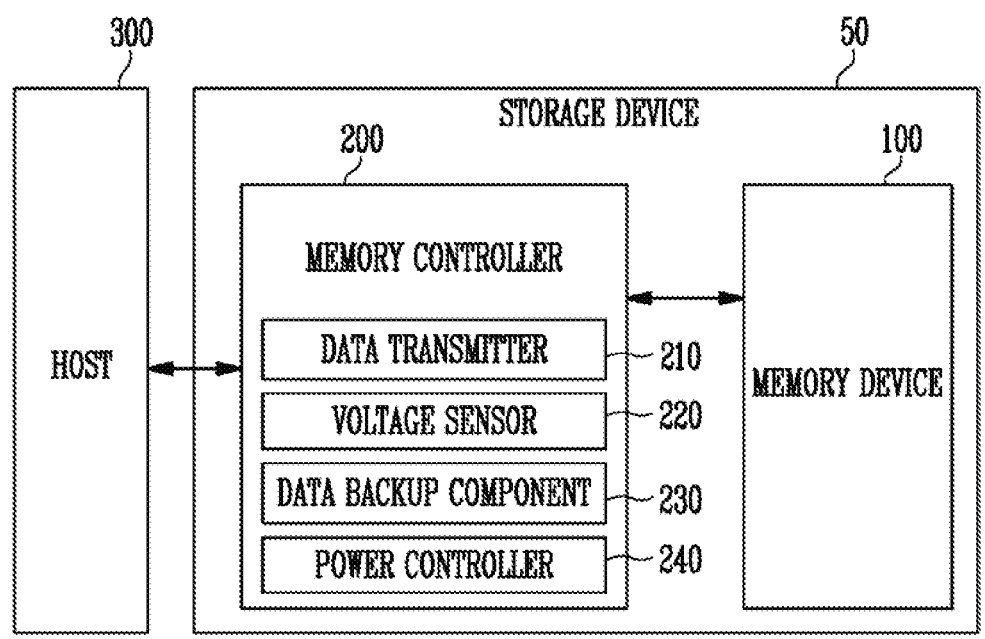
FIG. 1 is a block diagram illustrating a storage device in accordance with an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will now be described based on embodiments. The present disclosure may, however, be embodied in many different forms and should not be construed as being limited to only the embodiments set forth herein, but should be construed as covering modifications, equivalents or alternatives falling within ideas and technical scopes of the present disclosure. However, it is to be understood that the present description is not intended to limit the present disclosure to those examples of embodiments, and the present disclosure is intended to cover not only the example of embodiments, but also various alternatives, modifications, equivalents and other embodiments that fall within the spirit and scope of the present disclosure.

It will be understood that, although the terms "first", "second", etc. may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure will now be described hereinafter with reference to the accompanying drawings.

Various embodiments of the present disclosure are directed to a memory controller configured to control reset of a power supply voltage, and a method of operating the memory controller.

FIG. 1 is a block diagram illustrating a storage device 50 in accordance with an embodiment of the present disclosure.

Referring to FIG. 1, the storage device 50 may include a memory device 100 and a memory controller 200.

The storage device 50 may be a device configured to store data under control of a host 300 such as a cellular phone, a smartphone, an MP3 player, a laptop computer, a desktop computer, a game machine, a TV, a tablet PC, or an in-vehicle infotainment system.

The storage device 50 may be manufactured as any one of various kinds of storage devices depending on a host interface, which is a communication system for communicating with the host 300. For example, the data storage device 50 may be configured of any one of various kinds of storage devices such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured in the form of any one of various package types. For instance, the storage device 50 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may store data therein. The memory device 100 may operate under control of the memory controller 200. The memory device 100 may include a memory cell array including a plurality of memory cells configured to store data therein. The memory cell array may include a plurality of memory blocks. Each memory block may include a plurality of memory cells. A plurality of memory cells may form a plurality of pages. In an embodiment, each page may be the unit of sorting data in the memory device 100 or reading stored data from the memory device 100. Each memory block may be the unit of erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, for the sake of explanation, it is assumed that the memory device 100 is a NAND flash memory.

The memory device 100 may be implemented in a two-dimensional array structure or a three-dimensional array structure. Hereinafter, although a three-dimensional array structure will be described for illustrative purposes, the present disclosure is not limited to the three-dimensional array structure. The present disclosure may be applied not only to a flash memory in which a charge storage layer is formed of a conductive floating gate (FG), but also to a charge trap flash (CTF) memory in which a charge storage layer is formed of an insulating layer.

In an embodiment, the memory device 100 may be operated in a single-level cell (SLC) manner of storing one data bit in each memory cell. Alternatively, the memory device 100 may be operated in a manner of storing at least two data bits in each memory cell. For example, the memory device 100 may be operated in a multi-level cell (MLC) manner of storing two data bits in each memory cell, a triple-level cell (TLC) manner of storing three data bits in each memory cell, or a quad-level cell (QLC) manner of storing four data bits in each memory cell.

The memory device 100 may receive a command and an address from the memory controller 200 and access an area of the memory cell array that is selected by the address. In other words, the memory device 100 may perform an operation corresponding to the command on the area selected by the address. For example, the memory device 100 may perform a write (program) operation, a read operation, or an erase operation, in response to a received command. For example, if a program command is received, the memory device 100 may program data in an area selected by an address. If a read command is received, the memory device 100 may read data from an area selected by an address. If an erase command is received, the memory device 100 may erase data from an area selected by an address.

The memory controller 200 may include a data transmitter 210. The data transmitter 210 may receive a request and data form the host 300. The request received from the host 300 may be a program (write) request, a read request, or an erase request. The data transmitter 210 may output, based on the request and the data received from the host 300, a command and the data to the memory device 100.

For example, if the request received from the host 300 is a program (write) request, the data transmitter 210 may output a program command and data to the memory device 100. If the request received from the host 300 is a read request, the data transmitter 210 may output a read command to the memory device 100. If the request received from the host 300 is an erase request, the data transmitter 210 may output an erase command to the memory device 100.

In an embodiment, if the level of a voltage to be applied to the memory controller 200 or the memory device 100 is equal to or less than a reference level, the data transmitter 210 may back up the command and the data rather than outputting the command and the data to the memory device 100. The reference level is greater than the voltage level for initiating reset of the memory device and the memory controller and less than the voltage level required for the memory device and the memory controller to perform an operation.

The memory controller 200 may include a voltage sensor 220. The voltage sensor 220 may detect a low voltage when the level of a voltage to be applied to the storage device 50 is equal to or less than the reference level. The voltage to be applied to the storage device 50 may be a voltage to be applied to the memory controller 200 or a voltage to be applied to the memory device 100. The voltage sensor 220 may detect a low voltage based on an internal operation of the memory controller or a signal or data received from the memory controller. Here, the low voltage may be a level before the memory device 100 resets the power supply voltage. In other words, the reference level may be a voltage level before the memory device 100 starts an operation of resetting the power supply voltage.

In an embodiment, if the voltage sensor 220 detects a low voltage equal to or less than the reference level, the voltage sensor 220 may generate detect information. The detect information may be provided to a data backup component 230 and a power supply controller 240.

The memory controller 200 may include the data backup component 230. If the voltage sensor 220 detects a low voltage equal to or less than the reference level, the data backup component 230 may back up a command generated based on a request received from the host 300 and data received from the host 300. After the power supply voltage of the storage device 500 is reset, the data backup component 230 may sequentially output the backed-up command and the data to the memory device 100 in a sequence in which the command and the data have been backed up. After the power supply voltage has been reset, an operation corresponding to the command and the data may be performed.

The memory controller 200 may include a power supply controller 240. The power supply controller 240 may control the power supply voltage of the storage device 50. In other words, the power supply controller 240 may control not only the power supply voltage of the memory controller 200 but also the power supply voltage of the memory device 100. The power supply controller 240 may receive detect information from the voltage sensor 220. The power supply controller 240 may output, to the memory device 100, a power supply voltage reset command for resetting the power supply voltage to be applied to the memory device 100 based on the detect information.

The memory controller 200 may control overall operations of the storage device 50.

When a power supply voltage is applied to the storage device 50, the memory controller 200 may execute firmware (FW). In the case where the memory device 100 is a flash memory device 100, the memory controller 200 may execute firmware such as a flash translation layer (FTL) for controlling communication between the host 300 and the memory device 100.

In an embodiment, the memory controller 200 may receive data and a logical block address (LBA) from the host 300, and translate the LBA into a physical block address (PBA) indicating addresses of memory cells in which data is to be stored, the memory cells being included in the memory device 100. The memory controller 200 may store, in a buffer memory, a logical-physical address mapping table indicating mapping relationship between logical block addresses LBA and physical block addresses PBA.

The memory controller 200 may control the memory device 100 to perform a program operation, a read operation, or an erase operation in response to a request from the host 300. For example, if a program request is received from the host 300, the memory controller 200 may change the program request into a program command, and provide the program command, a PBA, and data to the memory device 100. If a read request along with an LBA is received from the host 300, the memory controller 200 may change the read request into a read command, select a PBA corresponding to the LBA, and provide the read command and the PBA to the memory device 100. If an erase request along with an LBA is received from the host 300, the memory controller 200 may change the erase request into an erase command, select a PBA corresponding to the LBA, and provide the erase command and the PBA to the memory device 100.

In an embodiment, the memory controller 200 may autonomously generate a program command, an address and data without a request from the host 300, and transmit them to the memory device 100. For example, the memory controller 200 may provide a command, an address and data to the memory device 100 to perform background operations such as a program operation for wear leveling, and a program operation for garbage collection.

In an embodiment, the storage device 50 may further include a buffer memory (not illustrated). The memory controller 200 may control data exchange between the host 300 and the buffer memory (not illustrated). Alternatively, the memory controller 200 may temporarily store system data for controlling the memory device 100 in the buffer memory. For example, the memory controller 200 may temporarily store, to the buffer memory, data input from the host 300, and thereafter transmit the data temporarily stored in the buffer memory to the memory device 100.

In various embodiments, the buffer memory may be used as an operating memory or a cache memory of the memory controller 200. The buffer memory may store codes or commands to be executed by the memory controller 200. Alternatively, the buffer memory may store data to be processed by the memory controller 200.

In an embodiment, the buffer memory may be embodied using an SRAM or a DRAM such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or a rambus dynamic random access memory (RDRAM).

In various embodiments, the buffer memory may be provided outside the storage device 50. In this case, volatile memory devices 100 provided outside the storage device 50 may perform the function of the buffer memory.

In an embodiment, the memory controller 200 may control at least two or more memory devices 100. In this case, the memory controller 200 may control the memory devices 100 in an interleaving manner so as to enhance the operating performance.

The host 300 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multi-media card (MMC), embedded MMC (eMMC), dual in-line memory module (DIMM), registered DIMM (RDIMM), and load reduced DIMM (LRDIMM) communication methods.

Figure 2:
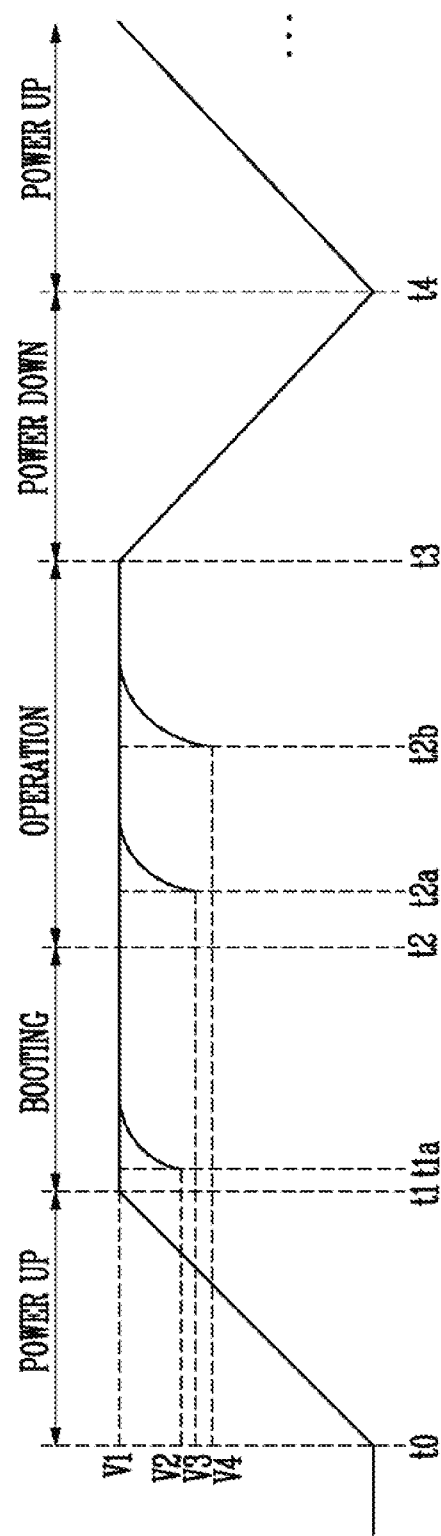
FIG. 2 is a diagram illustrating a section in which a voltage drop occurs and variation in power supply voltage when the voltage drop occurs.

FIG. 2 is a diagram illustrating a section in which a voltage drop occurs and variation in power supply voltage when the voltage drop occurs.

Referring to FIG. 2, the horizontal axis of FIG. 2 indicates passage of time after the power supply voltage has been applied, and the vertical axis of FIG. 2 indicates variation in power supply voltage.

In an embodiment, a power supply voltage may be applied to a storage device (50 of FIG. 1). In other words, the power supply voltage may be applied to a memory controller (200 of FIG. 1) and a memory device (100 of FIG. 1) that are included in the storage device. Each of the memory controller and the memory device that are included in the storage device may perform an operation using voltages generated based on the power supply voltage applied thereto.

For example, at time t0, a power supply voltage may be applied to the storage device. If the power supply voltage is applied to the storage device, the power supply voltage may increase from 0 V and reach level V1.

After at time t0 the power supply voltage has been applied to the storage device, the power supply voltage may increase (as indicated by "POWER UP") during a period from t0 to t1. In other words, the power supply voltage may increase so that the memory controller and the memory device that are included in the storage device may be operated. The power supply voltage may increase to level V1. If the level of the power supply voltage becomes V1, the storage device is allowed to perform a booting operation.

During a period from t1 to t2, the storage device may perform a booting operation (as indicated by "BOOTING"). In an embodiment, the booting operation may be a background operation which is performed before the storage device performs an operation. In other words, if the booting operation is completed, the storage device is allowed to perform an operation.

While the booting operation is performed, the level of the power supply voltage may remain at level V1.

In an embodiment, while the storage device performs the booting operation, the level of the power supply voltage may be reduced to a level equal to or less than level V1. The power supply voltage may drop due to an internal factor or an external factor.

If the power supply voltage is reduced to a level lower than a minimum voltage for performing the booting operation, the booting operation may be suspended. However, in the present disclosure, even if the power supply voltage is reduced to a level lower than the minimum voltage for performing the booting operation, the booting operation may be continuously performed without being suspended.

For example, at time t1a, the level of the power supply voltage may be reduced to level V2. The reduced power supply voltage may increase again. Here, the power supply voltage may be reset in a soft reset manner in which the power supply voltage increases from the reduced voltage level, rather than being reset in a hard reset manner in which the power supply voltage is reduced to 0 V and then increases again.

A suspended booting operation may be resumed after the power supply voltage level has increased. However, if the booting operation continues even after the power supply voltage has been reduced to a level lower than the minimum voltage for performing the booting operation, the booting operation may be defective. Due to the defective booting operation, the storage device may perform a defective operation. In this case, there is a need for the power supply voltage to be hard-reset.

If the power supply voltage is continuously reduced during the booting operation even after the power supply voltage has been soft-reset, there is a need for the power supply voltage to be hard-reset.

In an embodiment, even if the power supply voltage is reduced at time t1a, the power supply voltage may be soft-reset rather than being hard-reset. In other words, the power voltage is not reduced to 0 V, and only an operation of increasing the power supply voltage from the reduced voltage level may be performed. If the voltage that has been reduced at time t1a increases again, the booting operation may be continuously performed. If the power supply voltage is continuously reduced during the booting operation after time t1a, the power supply voltage may be hard-reset. If the power supply voltage is hard-reset, the power supply voltage may increase again from 0 V (as indicated by "POWER UP").

If the power supply voltage is hard-reset or soft-reset and then increases again, the booting operation may be continuously performed.

After the booting operation has been completed, an operation may be performed during a period from t2 to t3 (as indicated by "OPERATION"). The operation to be performed at time t2 may be an operation of the memory controller and the memory device for performing a program operation, a read operation, or an erase operation. While the memory controller and the memory device performs the operation (during the period from t2 to t3), the level of the power supply voltage may remain at level V1. In other words, the storage device may perform the operation using a power supply voltage of level V1.

However, while the storage device performs the operation, the power supply voltage that is applied to the memory controller and the memory device may be reduced. In an embodiment, the level of the power supply voltage may be reduced to V3 at time t2a and V4 at time t2b. The reduced power supply voltage may increase again. Here, the power supply voltage may be reset in a soft reset manner in which the power supply voltage increases from the reduced voltage level, rather than being reset in a hard reset manner in which the power supply voltage is reduced to 0 V and then increases again. Even if the power supply voltage is reduced at time t2a or t2b, the power supply voltage may be soft-reset rather than being hard-reset. In other words, the power voltage is not reduced to 0 V, and only an operation of increasing the power supply voltage from the reduced voltage level may be performed.

In an embodiment, if the power supply voltage applied to the storage device is reduced, the operation may be resumed when the power voltage is increased again to level V1.

However, despite the reduction of the power supply voltage, the operation may be continuously performed. In this case, an error may occur during the operation that is performed by the storage device. Therefore, to prevent the operation from being incorrectly performed, there is a need for the storage device to hard-reset the power supply voltage.

If the power supply voltage is continuously reduced at the operation step OPERATION even after the power supply voltage has been soft-reset, there is a need for the power supply voltage to be hard-reset. In other words, if the power supply voltage is continuously reduced at the operation step OPERATION after time t3, the power supply voltage may be hard-reset. If the power supply voltage is hard-reset, the power supply voltage may increase again from 0 V (as indicated by "POWER UP").

At time t3, to prevent an error from occurring during the operation that is performed by the storage device, the storage device may reset the power supply voltage. In this case, the power supply voltage may be hard-reset.

In other words, the memory device may reduce the power supply voltage to be applied to the storage device to 0V at time t3 (as indicated by "POWER DOWN"), and then increase the power supply voltage at time t4 (as indicated by "POWER UP"). The power supply voltage increased at time t4 may reach level V1 at which the storage device is allowed to perform the operation. Thereafter, the memory device may re-perform a booting operation, and perform a program operation or the like after having performed the booting operation.

Figure 3:
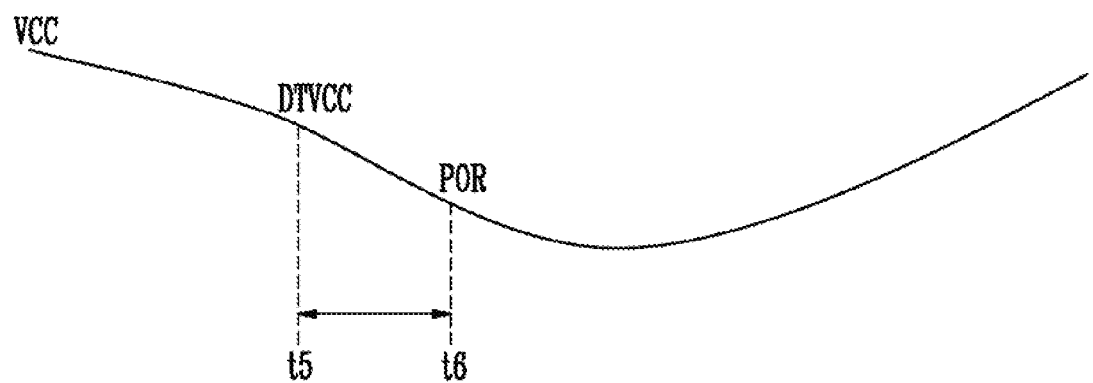
FIG. 3 is a diagram illustrating a section in which a memory device malfunctions due to a voltage drop.

FIG. 3 is a diagram illustrating a section in which the memory device malfunctions due to a voltage drop.

Referring to FIG. 3, the horizontal axis of FIG. 3 indicates passage of time after the power supply voltage has been increased. In other words, FIG. 3 illustrates variation in power supply voltage as a function of time.

In an embodiment, the level of the power supply voltage may be maintained at level VCC while the memory device (100 of FIG. 1) performs an operation. However, while the memory device performs the operation, the level of the power supply voltage to be applied to the storage device may be reduced by an external factor or an internal factor.

For example, at time t5, the level of the power supply voltage may be reduced from level VCC to level DTVCC.

In the conventional art, if the power supply voltage is reduced to level DTVCC, the memory device discharges voltages to be applied to components included in the memory device. Subsequently, the memory device performs an operation of autonomously resetting the power supply voltage. That is, the reference level is greater than the voltage level for initiating reset of the memory device and the memory controller and less than the voltage level required for the memory device and the memory controller to perform an operation and the resetting operation may be performed autonomously before a traditional resetting.

However, in the present disclosure, the power supply voltage may be reset by the memory controller.

In an embodiment, after the level of the power supply voltage has been reduced to level DTVCC, the level of the power supply voltage may be further reduced to level POR. If the level of the power supply voltage is level POR, the memory device may perform an operation for resetting the power supply voltage. If the power supply voltage is reset, the level of the power supply voltage may be increased to level VCC.

The memory device must suspend the operation during a period from t5 to t6, i.e., until the level of the power supply voltage becomes level POR after having been reduced to level DTVCC. However, if the memory device performs the operation even after the level of the power supply voltage has been reduced to level DTVCC, an error may occur during the operation that is performed by the memory device.

If the memory device has already performed a defective operation after the level of the power supply level has been reduced to level DTVCC, the operation may not be restored. Therefore, if the level of the power supply voltage is reduced to level DTVCC, the memory device may suspend the operation.

In an embodiment, if the level of the power supply voltage that has been reduced to level DTVCC is re-increased before becoming level POR, the power supply voltage may not be reset. In other words, if, after a defective operation is performed during the period from t5 to t6, the power supply voltage is re-increased before the level of the power supply voltage becomes level POR, the storage device may not recognize that the defective operation has been performed, whereby the power supply voltage may not be reset.

In the conventional art, when the level of the power supply voltage is reduced to level POR via level DTVCC, the memory device performs an operation for resetting the power supply voltage. In other words, the operation for resetting the power supply voltage is not performed when the level of the power supply voltage is reduced to level DTVCC. The memory device performs the operation for resetting the power supply voltage when the level of the power supply voltage becomes level POR.

Consequently, in the conventional art, when the level of the power supply voltage becomes level DTVCC, the memory device discharges voltages to be applied to the components of the memory device. Thereafter, when the level of the power supply voltage becomes level POR, the memory device performs the operation for resetting the power supply voltage. That is, level DTVCC, the reference level, is greater than the level POR for initiating reset of the memory device and the memory controller and less than the voltage level required for the memory device and the memory controller to perform an operation.

Therefore, since the operation of the memory device is performed in a section in which the level of the power supply voltage is lower than level DTVCC and higher than level POR, an error may occur. In other words, in conventional art, referring to FIG. 3, because the memory device performs the operation during the period from t5 to t6, an error may occur.

However, in the present disclosure, at time t5, i.e., when the level of the power supply voltage is level DTVCC, the power supply voltage may be reset. For example, when the level of the power supply voltage is reduced from level VCC to level DTVCC, the power supply voltage may be soft-reset. In other words, the power supply voltage may be reset in a soft reset manner in which the power supply voltage increases from the reduced voltage level, rather than being reset in a hard reset manner in which the power supply voltage reduces to 0 V and then increases again.

Thereafter, if the power supply voltage is continuously reduced even after the soft-reset has been performed, the power supply voltage may be hard-reset. That is, the power supply voltage may be lowered several times below the reference level. If the power supply voltage is hard-reset, the power supply voltage may increase again from 0 V (as indicated by "POWER UP").

Hereinafter, a method of performing by the memory device an operation for resetting the power supply voltage will be described. Furthermore, a method of backing up a command and data when the power supply voltage is reduced to level DTVCC in accordance with the present disclosure will be described.

Figure 4:
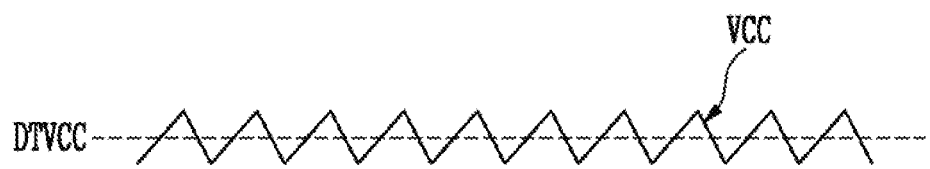
FIG. 4 is a diagram for describing a voltage noise.

FIG. 4 is a diagram for describing a voltage noise.

FIG. 4 illustrates a power supply voltage to be applied to the storage device (50 of FIG. 1). The level of the power supply voltage may not be constant due to an external noise or an internal noise.

In an embodiment, the power supply voltage may be a voltage to be applied to the storage device. For example, the power supply voltage may be applied to the memory controller (200 of FIG. 1) and the memory device (100 of FIG. 1).

The power supply voltage may be equal to or greater than level DTVCC. In other words, the power supply voltage of level DTVCC may be a minimum voltage for a normal operation of the storage device.

However, due to an external noise or an internal noise, the level of the power supply voltage may not be constant at a specific level, but may vary to be any one level among levels between a level lower than level DTVCC and a level greater than level DTVCC as time passes. In other words, the power supply voltage may be unstable due to the external noise or the internal noise.

If the level of the power supply voltage is unstable, an error may occur during an operation that is performed by the memory device. In this case, there is a need to reset the power supply voltage. In other words, to re-increase the reduced power supply voltage, the power supply voltage may be further reduced to 0 V and then re-increased.

In an embodiment, when a glitch phenomenon occurs or an undesired discharge phenomenon occurs while the power supply voltage is applied, the power supply voltage may also be unstable. In this case, there is also a need to reset the power supply voltage.

If the power supply voltage is reset, the power supply voltage may reach a normal level.

Figure 5:
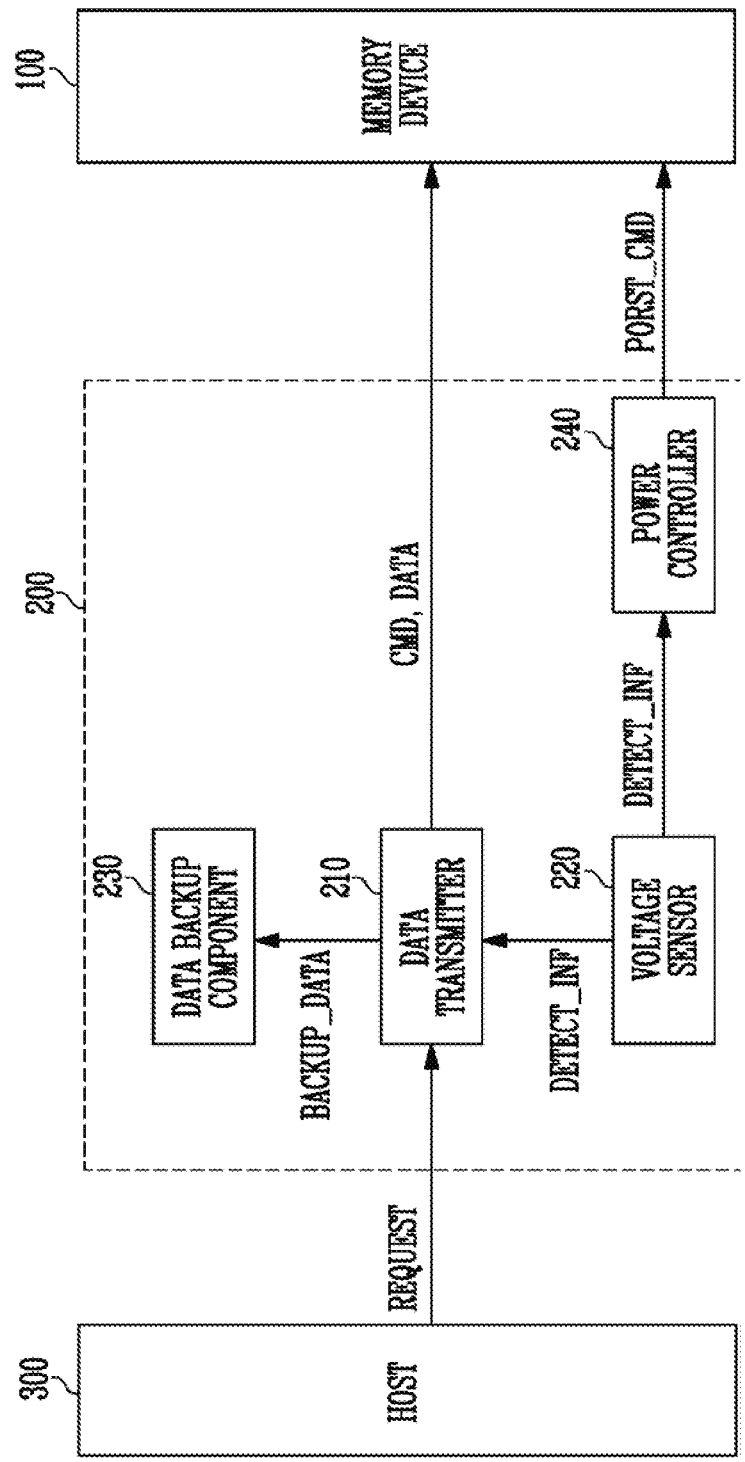
FIG. 5 is a diagram for describing the configuration of the memory controller of FIG. 1 and an operation of the memory controller when in a low-voltage state in accordance with an embodiment of the present disclosure.

FIG. 5 is a diagram for describing the configuration of the memory controller 200 of FIG. 1 and an operation of the memory controller 200 when in a low-voltage state in accordance with an embodiment of the present disclosure. The low-voltage state means that the power supply voltage level is greater than the voltage level for initiating reset of the memory device and the memory controller and less than the voltage level required for the memory device and the memory controller to perform an operation.

Referring to FIG. 5, the memory controller 200 may include a data transmitter 210, a voltage sensor 220, a data backup component 230, and a power supply controller 240 (i.e. power controller).

The data transmitter 210 may receive a request REQUEST form the host 300. The request REQUEST received from the host 300 may be a program request, a read request, or an erase request. The request REQEST received from the host 300 may be any one of various requests including not only the above-mentioned requests but also other kinds of requests.

The data transmitter 210 may receive data along with the request REQUEST form the host 300. The data received from the host 300 may be data to be programmed to the memory device 100.

The data transmitter 210 may output, based on the request REQUEST and the data received from the host 300, a command CMD and data DATA to the memory device 100. The command CMD output to the memory device 100 may be a command corresponding to the request REQUEST received from the host 300.

In an embodiment, if the request REQUEST received from the host 300 is a program request, the data transmitter 210 may output, to the memory device 100, data and a program command corresponding to the program request. In an embodiment, if the request REQUEST received from the host 300 is a read request or an erase request, the data transmitter 210 may output, to the memory device 100, a read command corresponding to the read request or an erase command corresponding to the erase request.

The data transmitter 210 may receive detect information DETECT_INF from the voltage sensor 220. The detect information DETECT_INF may be generated when a power supply voltage to be applied to the memory controller 200 or the memory device 100 is equal to or less than a reference level. The reference level may be a voltage level before the memory device 100 starts an operation of resetting the power supply voltage. Moreover, the reference level is greater than the voltage level for initiating reset of the memory device and the memory controller and less than the voltage level required for the memory device and the memory controller to perform an operation. Here, the power supply voltage may be reset in a soft reset manner in which the power supply voltage increases from the reduced voltage level, rather than being reset in a hard reset manner in which the power supply voltage is reduced to 0 V and then increases again.

When the detect information DETECT_INF is received, the data transmitter 210 may back up the data and the command corresponding to the request REQUEST received from the host 300. In other words, the data transmitter 210 may output, to the data backup component 230, backup data BACKUP_DATA including the data and the command corresponding to the request REQUEST received from the host 300.

The voltage sensor 220 may detect whether or not a power supply voltage applied to the storage device is equal to or less than the reference level. For example, a power supply voltage to be applied to the memory controller 200 or the memory device 100 may be equal to or less than the reference level due to an external factor or an internal factor. If a power supply voltage to be applied to the memory controller 200 or the memory device 100 is equal to or less than the reference level, an error may occur during an operation that is performed by the memory controller 200 or the memory device 100. Therefore, in the present disclosure, to prevent an error from occurring during the operation that is performed by the memory controller 200 or the memory device 100, the voltage sensor 220 may detect whether the power supply voltage is equal to or less than the reference level, and generate detect information DETECT_INF when the power supply voltage is equal to or less than the reference level.

In an embodiment, if the power supply voltage is equal to or less than the reference level and detect information DETECT_INF is thus generated, the voltage sensor 220 may output the detect information DETECT_INF to the data transmitter 210 and the power supply controller 240. The data transmitter 210 and the power supply controller 240 may perform, based on the received detect information DETECT_INF, an operation of backing up the command and the data and an operation of resetting the power supply voltage to be applied to the memory device 100.

For example, if the power supply voltage is equal to or less than the reference level, the data transmitter 210 may receive detect information DETECT_INF from the voltage sensor 220. The data transmitter 210 might not output data and a command corresponding to a request REQUEST received from the host 300 since the detect information DETECT_INF has been received. In other words, when the power supply voltage is equal to or less than the reference level, the data transmitter 210 might not output a command and data to the memory device 100 so that the memory device 100 does not perform an operation until the power supply voltage to be applied to the memory device 100 is reset.

The data transmitter 210 may output backup data BACKUP_DATA to the data backup component 230 after the detect information DETECT_INF has been received. The backup data BACKUP_DATA may include data and a command corresponding to a request REQUEST received from the host 300 after the detect information DETECT_INF has been received, and data and a command corresponding to an operation that is being performed by the memory device 100 when the power supply voltage is equal to or less than the reference level.

The data backup component 230 may store the backup data BACKUP_DATA received from the data transmitter 210. The data backup component 230 may output the backup data BACKUP_DATA to the data transmitter 210 after the power supply voltage to be applied to the memory device 100 has been reset. Thereafter, the data transmitter 210 may output the backup data BACKUP_DATA to the memory device 100, and the memory device 100 may perform an operation based on the backup data BACKUP_DATA.

The power supply controller 240 may receive the detect information DETECT_INF from the voltage sensor 220. The power supply controller 240 may output a power supply voltage reset command PORST_CMD to the memory device 100 based on the detect information DETECT_INF. The power supply voltage reset command PORST_CMD may be a command for resetting a power supply voltage to be applied to the memory device 100. The power voltage reset command PORST_CMD may be a command not for directly increasing a reduced power supply voltage, but for reducing the power supply voltage to the ground voltage (0 V) and then re-increasing the power supply voltage. After receiving the power supply voltage reset command PORST_CMD, the memory device 100 may reset the power supply voltage.

Figures 6, 7:
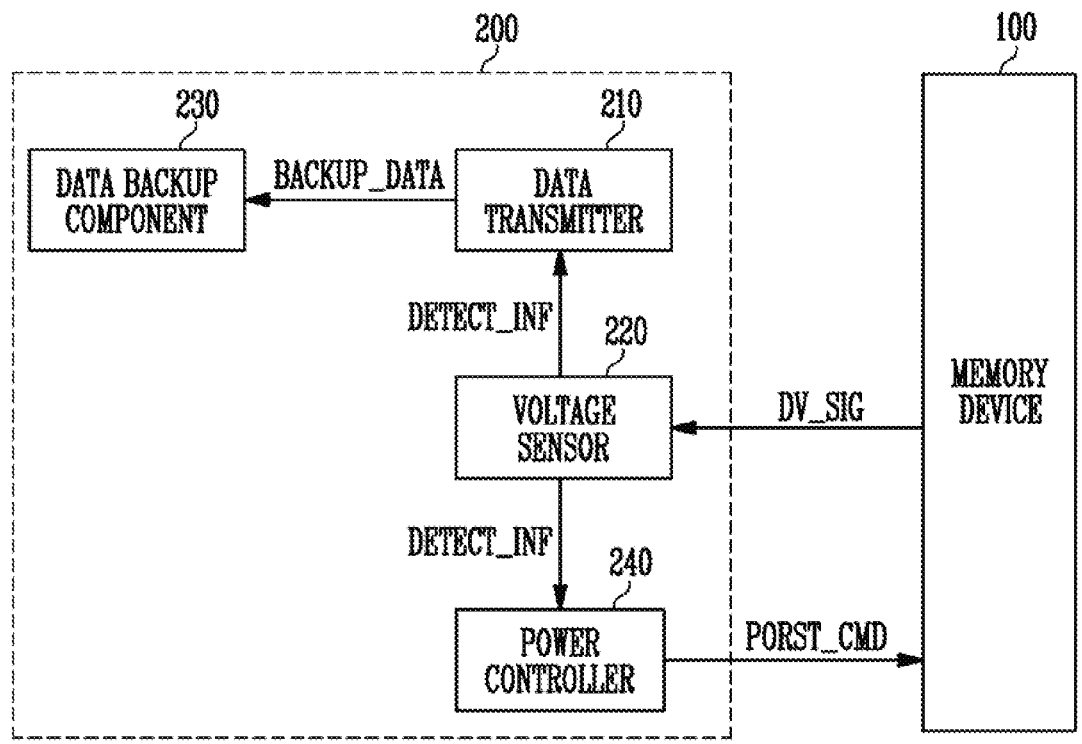
FIG. 6 is a diagram for describing a command and data received from the host and backup of the command and the data, in accordance with an embodiment of the present disclosure.
FIG. 7 is a diagram for describing an operation of the memory controller when a low-voltage signal is received from the memory device in accordance with an embodiment of the present disclosure.

FIG. 6 is a diagram for describing a command and data received from the host and backup of the command and the data, in accordance with an embodiment of the present disclosure.

Referring to FIG. 6, a first column indicates a sequence in which the data transmitter (210 of FIG. 5) receives requests from the host (300 of FIG. 5), and a second column indicates commands and data corresponding to the requests received from the host to the data transmitter. The requests received from the host may include various requests including a program request, a read request, and an erase request.

In FIG. 6, it is assumed that a first command CMD1 is a command corresponding to a first program request, first data DATA1 is data for performing the first command CMD1, a second command CMD2 is a command corresponding to a first read request, a third command CMD3 is a command corresponding to a second program request, third data DATA3 is data for performing the third command CMD3, and a fourth command CMD4 is a command corresponding to a second read request.

In an embodiment, a request that has been first received from the host may be the first program request. Therefore, the data transmitter may output, to the memory device (100 of FIG. 5), the first data DATA1 and the first command CMD1 corresponding to the first program request. The memory device may receive the first command CMD1 and the first data DATA1 and perform a program operation corresponding to the first program request.

Subsequently, the data transmitter may receive the first read request from the host. Therefore, the data transmitter may output, to the memory device, the second command CMD2 corresponding to the first read request without outputting data.

While the memory device performs a read operation corresponding to the second command CMD2, the voltage sensor (220 of FIG. 5) may detect that the level of the power supply voltage becomes equal to or less than the reference level. In this case, the memory controller may output a power supply reset command to the memory device. The memory device may receive the power supply reset command and suspend a first read operation.

Therefore, to reset the power supply voltage to be applied to the memory device, not only the second command CMD2 that has been being performed by the memory device but also data and commands corresponding to requests received since then may be backed up. In other words, the data transmitter may transmit, to the data backup component (230 of FIG. 5), backup data including the second command CMD2, the third command CMD3 the third data DATA3, and the fourth command CMD4. The data backup component may store the backup data. The operation of storing the backup data in the data backup component may be performed simultaneously with the operation of resetting the power supply voltage to be applied to the memory device or performed before the reset operation.

If the power supply voltage to be applied to the memory device is reset, the data backup component may output the backup data to the memory device. In other words, if the power supply voltage is reset, the data backup component may sequentially output commands to the memory device in a sequence from the second command CMD2. Therefore, the memory device may first receive the second command CMD2 and perform a read operation corresponding to the second command CMD2. Thereafter, the memory device may receive the third command CMD3 and the third data DATA3 and perform a program operation, and may receive the fourth command CMD4 and perform a read operation.

In an embodiment, if the power supply voltage becomes equal to or less than the reference level while the memory device performs the third command CMD3 corresponding to the second program request, the voltage sensor may generate detect information. The data transmitter may receive detect information and transmit, to the data backup component, backup data including not only the third command CMD3 corresponding to the program operation that is being performed by the memory device but also the third data DATA3 and the fourth command CMD4. Therefore, the data backup component may store the third command CMD3, the third data DATA3, and the fourth command CMD4. In other words, if the power supply voltage becomes equal to or less than the reference level during the program operation, not only the program command but also data corresponding to the program command may be backed up.

Subsequently, if the power supply voltage is reset, the data backup component may sequentially output commands to the memory device in a sequence from the third command CMD3, and the memory device may re-perform program operations in a sequence from a program operation corresponding to the third command CMD3.

FIG. 7 is a diagram for describing an operation of the memory controller 200 when a low-voltage signal is received from the memory device 100 in accordance with an embodiment of the present disclosure.

Referring to FIG. 7, the voltage sensor 220 of FIG. 7 may receive a low-voltage signal DV_SIG from the memory device 100. The low-voltage signal DV_SIG may be a signal indicating that the power supply voltage to be applied to the memory device 100 has been equal to or less than the reference level. The reference level may be a voltage level before the memory device 100 starts to reset the power supply voltage. In other words, the memory controller 200 of FIG. 7 may control the memory device 100 to reset the power supply voltage to be applied to the memory device 100 based on a signal received from the memory device before the memory device 100 autonomously resets the power supply voltage. That is, the reference level is greater than the voltage level for initiating reset of the memory device and the memory controller and less than the voltage level required for the memory device and the memory controller to perform an operation and the resetting operation may be performed autonomously before a traditional resetting.

In an embodiment, the memory device may output the low-voltage signal DV_SIG to the memory controller 200. The low-voltage signal DV_SIG may be a signal which is output when the power supply voltage to be applied to the memory device 100 is equal to or less than the reference level. The memory device 100 might not reset the power supply voltage even when outputting the low-voltage signal DV_SIG. In other words, when the low-voltage signal DV_SIG is output, the power supply voltage might not be reset.

If the memory device 100 performs an operation without resetting the power supply voltage to be applied to the memory device 100, an error may occur. Therefore, in the present disclosure, an operation of the memory controller 200 for resetting the power supply voltage to be applied to the memory device 100 is proposed.

In an embodiment, the voltage sensor 220 may receive a low-voltage signal DV_SIG from the memory device 100. If the voltage sensor 220 receives the low-voltage signal DV_SIG, detect information DETECT_INF may be generated in the same manner as that of the case where the power supply voltage to be applied to the storage device is equal to or less than the reference level. In other words, the voltage sensor 220 may generate detect information DETECT_INF for resetting the power supply voltage to be applied to the memory device 100. The voltage sensor 220 may output the generated detect information DETECT_INF to the data transmitter 210 and the power supply controller 240.

In an embodiment, the data transmitter 210 might not output a command and data to the memory device 100, unlike that of the embodiment of FIG. 5. The data transmitter 210 may output backup data BACKUP_DATA including a command that is being performed by the memory device 100 to the data backup component 230. The data backup component 230 may back up the command and the data. The data backup component 230 may output the backup data BACKUP_DATA to the data transmitter 210 after the power supply voltage to be applied to the memory device 100 has been reset. The data transmitter 210 may sequentially output commands to the memory device 100 in a sequence from a command corresponding to an operation that has been suspended among the backup data BACKUP_DATA.

In an embodiment, the power supply controller 240 may receive the detect information DETECT_INF from the voltage sensor 220. If the power supply controller 240 receives the detect information DETECT_INF, the power supply controller 240 may output a power supply voltage reset command PORST_CMD to the memory device 100. The power supply voltage reset command PORST_CMD may be a command for resetting a power supply voltage to be applied to the memory device 100.

The memory device 100 may receive the power supply voltage reset command PORST_CMD, reduce the power supply voltage to 0 V, and then re-increase the power supply voltage. Consequently, the memory device 100 may reset the power supply voltage.

Figure 8:
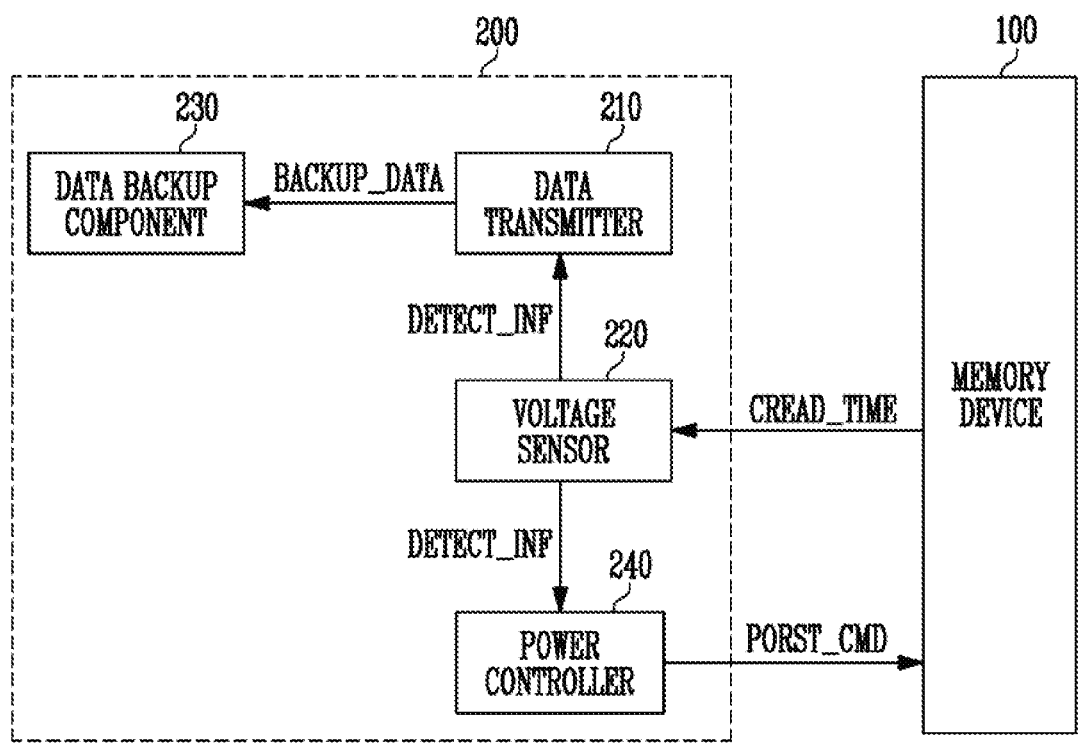
FIG. 8 is a diagram for describing an operation of the memory controller when a cam block read time is received from the memory device in accordance with an embodiment of the present disclosure.

FIG. 8 is a diagram for describing an operation of the memory controller 200 when a cam block read time is received from the memory device 100 in accordance with an embodiment of the present disclosure.

Referring to FIGS. 7 and 8, the operation of the memory controller 200 of FIG. 8, other than the fact that the voltage sensor 220 receives a content addressable memory (CAM) block read time CREAD_TIME from the memory device 100, is the same as that of the embodiment of FIG. 7; therefore, repetitive explanation thereof will be omitted.

In an embodiment, the memory device 100 may output a CAM block read time CREAD_TIME to the memory controller 200. The CAM block read time CREAD_TIME may be the time it takes for the memory device 100 to read data of a CAM block included in the memory cell array after having performed a booting operation. The CAM block may include bad block information, code information for setting the control logic, and column information.

In an embodiment, if the CAM block read time CREAD_TIME is equal to or less than a reference time, some of the data in the CAM block may not be read. In other words, despite the fact that the memory device 100 has to read all of the data of the CAM block to normally perform an operation, some of the data of the CAM block may not be read. This may be determined based on the time used to read the data stored in the CAM block.

In the case where the time used to read the data stored in the CAM block is relatively short, it may be determined that all of the data of the CAM block has not been read because the power supply voltage applied to the memory device 100 has been lower than the reference level. The reference level may be a voltage level before the memory device 100 starts to reset the power supply voltage. In this case, there is a need to reset the power supply voltage to be applied to the memory device 100.

The memory device 100 may output, to the memory controller 200, a CAM block read time CREAD_TIME that is the time used to read the data stored in the CAM block. The CAM block read time CREAD_TIME may be less than the reference time.

In an embodiment, the voltage sensor 220 may determine whether the CAM block read time CREAD_TIME is less than the reference time. If the CAM block read time CREAD_TIME is less than the reference time, the voltage sensor 220 may generate detect information DETECT_INF in the same manner as that of the embodiment of FIG. 7, and output the generated detect information DETECT_INF to the data transmitter 210 and the power supply controller 240. Here, the resetting operation may be performed autonomously before a traditional resetting.

The data transmitter 210 may store backup data BACKUP_DATA in the data backup component 230 based on the detect information DETECT_INF. The power supply controller 240 may output a power supply voltage reset command PORST_CMD to the memory device 100 based on the detect information DETECT_INF. The memory device 100 may reset the power supply voltage to be applied to the memory device 100, based on the power supply voltage reset command PORST_CMD.

In an embodiment, even though a power supply voltage reset operation corresponding to the power supply voltage reset command PORST_CMD has been performed, the number of times the power supply voltage reset operation has been performed may be increased because the CAM block read time CREAD_TIME is less than the reference time. In the case where the number of time the power supply voltage reset operation has been performed exceeds a preset reference count, the memory device including the corresponding CAM block may no longer be used (Chip-Kill). The word "preset" as used herein with respect to a parameter, such as a preset reference count, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In other words, if based on the CAM block read time CREAD_TIME read data obtained by reading the CAM block included in the memory device is determined to be unreliable data, the memory device including the corresponding CAM block may no longer be used (Chip-Kill) because the power supply voltage cannot be continuously reset.

Figure 9:
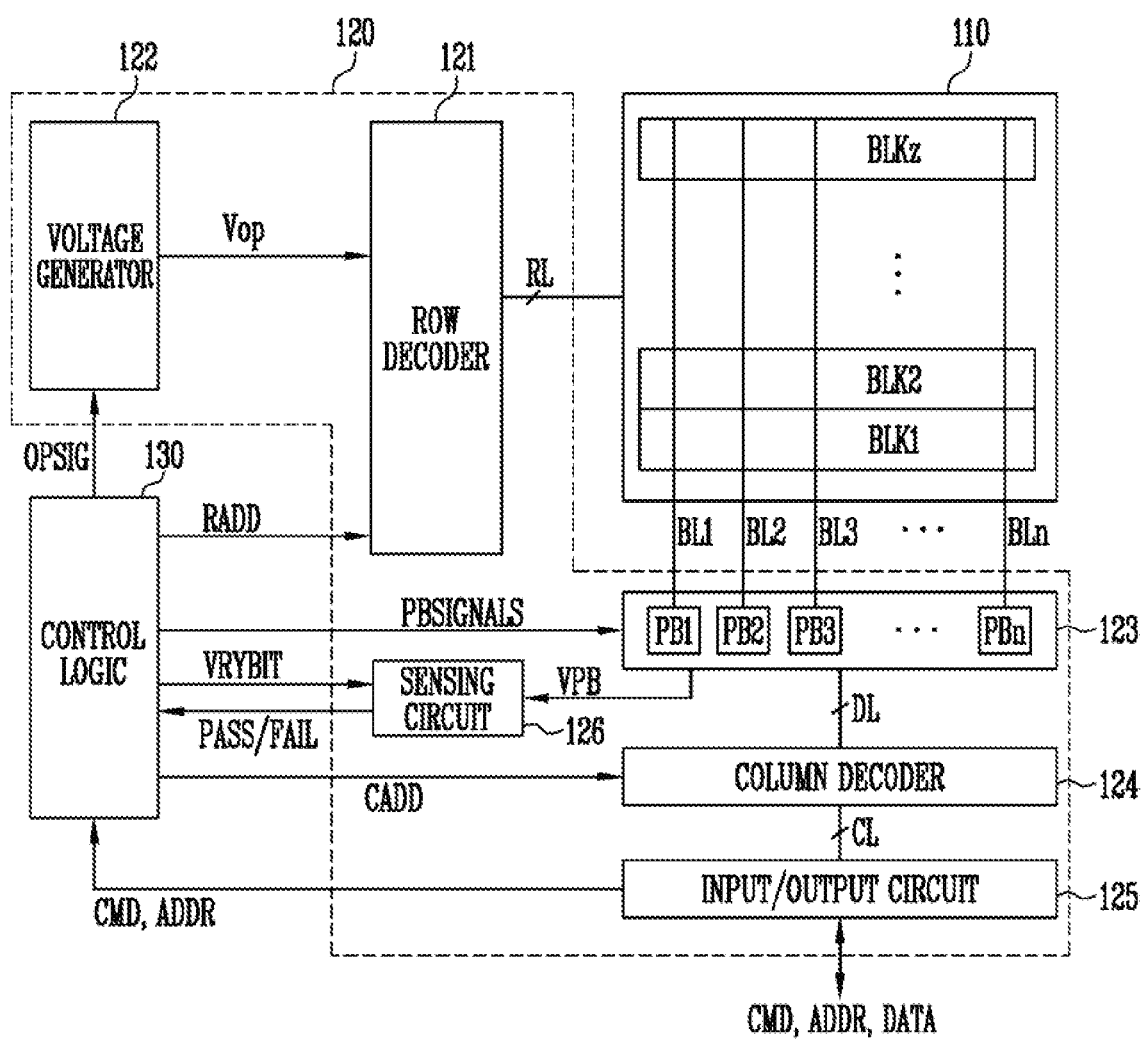
FIG. 9 is a diagram illustrating the configuration of the memory device of FIG. 1.

FIG. 9 is a diagram illustrating the configuration of the memory device 100 of FIG. 1.

Referring to FIG. 9, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 may include a plurality of memory blocks BLK1 to BLKz. The plurality of memory blocks BLK1 to BLKz are coupled to a row decoder 121 through row lines RL. The plurality of memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as one page. Hence, each memory block may include a plurality of pages.

The row lines RL may include at least one source select line, a plurality of word lines, and at least one drain select line.

Each of the memory cells included in the memory cell array 110 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may perform a program operation, a read operation, or an erase operation on a selected area of the memory cell array 110 under control of the control logic 130. The peripheral circuit 120 may drive the memory cell array 110. For example, the peripheral circuit 120 may apply various operating voltages to the row liens RL and the bit lines BL1 to BLn or discharge the applied voltages, under control of the control logic 130.

The peripheral circuit 120 may include the row decoder 121, a voltage generator 122, the page buffer group 123, a column decoder 124, an input/output circuit 125, and a sensing circuit 126.

The row decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may decode a row address RADD received from the control logic 130. The row decoder 121 may select at least one memory block of the memory blocks BLK1 to BLKz in response to the decoded address. The row decoder 121 may select at least one word line WL of the selected memory block in response to the decoded address so that voltages generated from the voltage generator 122 are applied to the at least one word line WL.

For example, during a program operation, the row decoder 121 may apply a program voltage to a selected word line and apply a program pass voltage having a level lower than that of the program voltage to unselected word lines. During a program verify operation, the row decoder 121 may apply a verify voltage to a selected word line and apply a verify pass voltage higher than the verify voltage to unselected word lines. During a read operation, the row decoder 121 may apply a read voltage to a selected word line and apply a read pass voltage higher than the read voltage to unselected word lines.

In an embodiment, an erase operation of the memory device 100 may be performed on a memory block basis. During an erase operation, the row decoder 121 may select one memory block in response to a decoded address. During the erase operation, the row decoder 121 may apply a ground voltage to word lines coupled to the selected memory block.

The voltage generator 122 may operate under control of the control logic 130. The voltage generator 122 may generate a plurality of voltages using an external power supply voltage supplied to the memory device 100. For example, the voltage generator 122 may generate various operating voltages Vop to be used for a program operation, a read operation, and an erase operation in response to an operating signal OPSIG. For example, the voltage generator 122 may generate a program voltage, a verify voltage, a pass voltage, a read voltage, an erase voltage, and so forth under control of the control logic 130.

In an embodiment, the voltage generator 122 may generate an internal power supply voltage by regulating the external power supply voltage. The internal power supply voltage generated from the voltage generator 122 may be used as an operating voltage of the memory device 100.

In an embodiment, the voltage generator 122 may generate a plurality of voltages using an external power supply voltage or an internal power supply voltage.

For example, the voltage generator 122 may include a plurality of pumping capacitors for receiving the internal supply voltage and generate a plurality of voltages by selectively activating the plurality of pumping capacitors under control of the control logic 130.

The generated voltages may be supplied to the memory cell array 110 by the row decoder 121.

The page buffer group 123 may include first to n-th page buffers PB1 to PBn. The first to n-th page buffers PB1 to PBn are coupled to the memory cell array 110 through the first to n-th bit lines BL1 to BLn, respectively. The first to n-th page buffers PB1 to PBn may operate under control of the control logic 130. For example, the first to n-th page buffers PB1 to PBn may operate in response to page buffer control signals PBSIGNALS. For instance, the first to n-th page buffers PB1 to PBn may temporarily store data received through the first to n-th bit lines BL1 to BLn, or sense voltages or currents of the first to n-th bit lines BL1 to BLn during a read operation or a verify operation.

For example, during a program operation, the first to n-th page buffers PB1 to PBn may transmit data DATA received through the input/output circuit 125 to selected memory cells through the first to n-th bit lines BL1 to BLn when a program voltage is applied to a selected word line. The memory cells in the selected page are programmed based on the transmitted data. During a program verify operation, the first to n-th page buffers PB1 to PBn may read page data by sensing voltages or currents received from selected memory cells through the first to n-th bit lines BL1 to BLn.

During a read operation, the first to n-th page buffers PB1 to PBn may read data DATA from memory cells of a selected page through the first to n-th bit lines BL1 to BLn, and output the read data DATA to the data input/output circuit 125 under control of the column decoder 124.

During an erase operation, the first to n-th page buffers PB1 to PBn may float the first to n-th bit lines BL1 to BLn or apply erase voltages thereto.

The column decoder 124 may transmit data between the input/output circuit 125 and the page buffer group 123 in response to a column address CADD. For example, the column decoder 124 may exchange data with the first to n-th page buffers PB1 to PBn through data lines DL or exchange data with the input/output circuit 125 through column lines CL.

The input/output circuit 125 may transmit, to the control logic 130, a command CMD or an address ADDR received from the memory controller (200 of FIG. 1) described with reference to FIG. 1, or may exchange data DATA with the column decoder 124.

During a read operation or a verify operation, the sensing circuit 126 may generate a reference current in response to an allowable bit signal VRYBIT, and may compare a sensing voltage VPB received from the page buffer group 123 with a reference voltage generated by the reference current and output a pass signal PASS or a fail signal FAIL.

The control logic 130 may output an operating signal OPSIG, a row address RADD, page buffer control signals PBSIGNALS, and an enable bit signal VRYBIT in response to a command CMD and an address ADD, and thus control the peripheral circuit 120. In addition, the control logic 130 may determine whether a target memory cell has passed a verification during a verify operation in response to a pass signal PASS or a fail signal FAIL.

Each of the memory cells included in the memory cell array 110 may be programmed to any one programmed state among a plurality of programmed states depending on data to be stored in the corresponding memory cell. A target programmed state of a memory cell may be determined to be any one of the plurality of programmed states depending on data to be stored therein FIG. 10 is a diagram illustrating an embodiment of a memory cell array 110 of FIG. 9.

Figure 10:
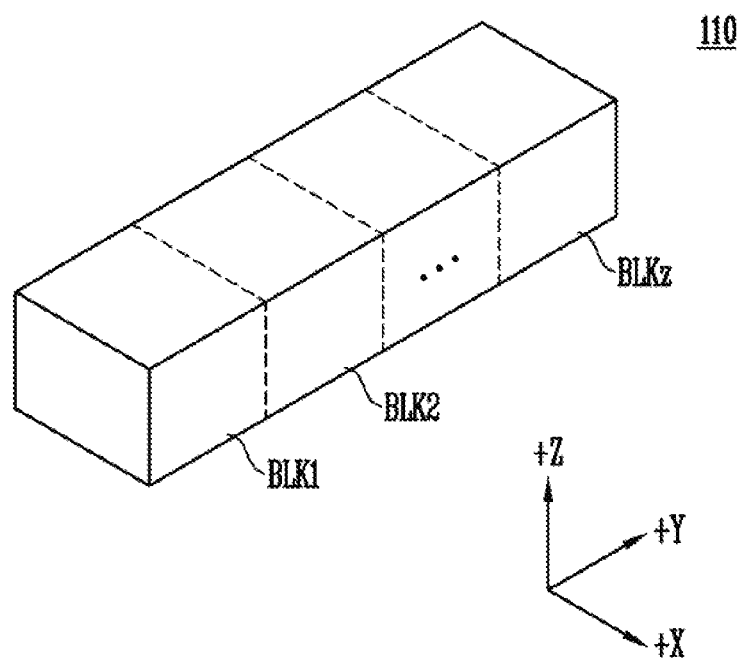
FIG. 10 is a diagram illustrating an embodiment of a memory cell array of FIG. 9.

Referring to FIG. 10, the memory cell array 110 may include a plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 11 and 12.

Figure 11:
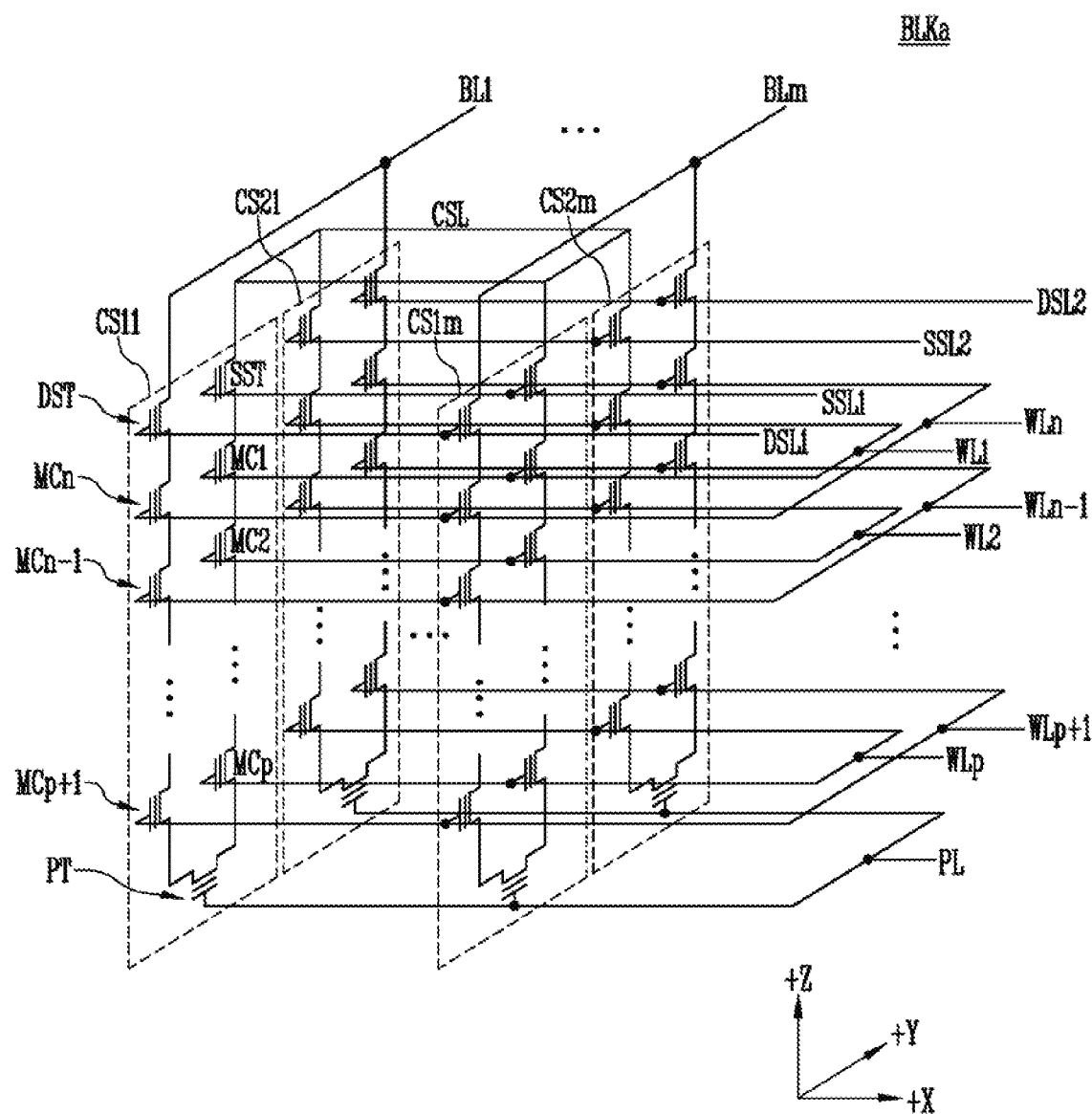
FIG. 11 is a circuit diagram illustrating any one memory block BLKa of memory blocks BLK1 to BLKz of FIG. 10, in accordance with an embodiment of the present disclosure.

FIG. 11 is a circuit diagram illustrating any one memory block BLKa of memory blocks BLK1 to BLKz of FIG. 10, in accordance with an embodiment of the present disclosure.

Referring to FIG. 11, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e., the +X direction). In FIG. 11, two cell strings are illustrated as being arranged in a column direction (i.e., the +Y direction). However, this illustration is made only for convenience of description, and it will be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 11, source select transistors of the cell strings CS11 to CS1m in a first row are coupled to a first source select line SSL1. Source select transistors of the cell strings CS21 to CS2m in a second row are coupled to a second source select line SSL2.

In an embodiment, the source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 11, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number-th cell strings of the cell strings CS11 to CS1m or CS21 to CS2m arranged in the row direction may be coupled to respective even bit lines. Odd-number-th cell strings of the cell strings CS11 to CS1m or CS21 to CS2m arranged in the row direction may be coupled to respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCp. Alternatively, at least one or more dummy memory cells may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the at least one dummy memory cells, each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 12:
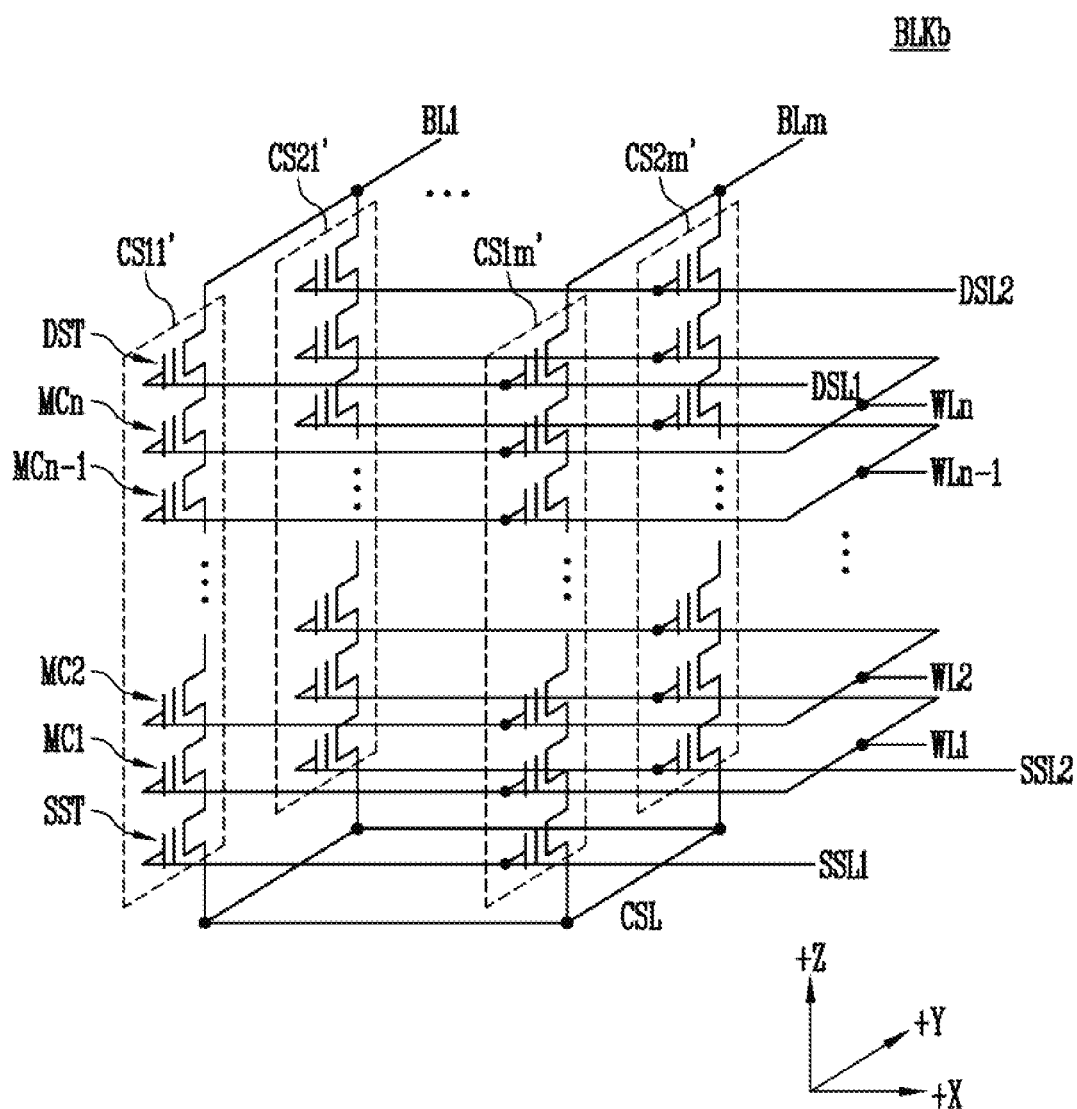
FIG. 12 is a circuit diagram illustrating any one memory block BLKb of the memory blocks BLK1 to BLKz of FIG. 10, in accordance with an embodiment of the present disclosure.

FIG. 12 is a circuit diagram illustrating any one memory block BLKb of the memory blocks BLK1 to BLKz of FIG. 10, in accordance with an embodiment of the present disclosure.

Referring to FIG. 12, the memory block BLKb may include a plurality of cell strings CS11' to CS1m' and CS21' to CS2m'. Each of the cell strings CS11' to CS1m' and CS21' to CS2m' extends in the +Z direction. Each of the cell strings CS11' to CS1m' and CS21' to CS2m' may include at least one source select transistor SST, first to n-th memory cells MC1 to MCn, and at least one drain select transistor DST which are stacked on a substrate (not shown) provided in a lower portion of the memory block BLK1'.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

Consequently, the memory block BLKb of FIG. 12 may have an equivalent circuit similar to that of the memory block BLKa of FIG. 11 except that a pipe transistor PT is excluded from each cell string.

In an embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

Furthermore, to reduce an electric field between the source select transistor SST and the memory cells MC1 to MCn, at least one of the first to n-th memory cells MC1 to MCn may be used as a dummy memory cell.

Figure 13:
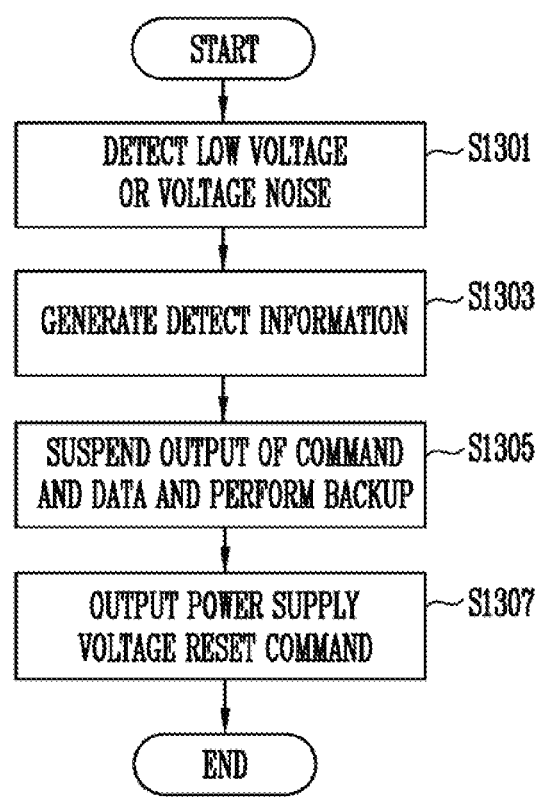
FIG. 13 is a diagram illustrating an operation of the memory controller in accordance with an embodiment of the present disclosure.

FIG. 13 is a diagram illustrating an operation of the memory controller in accordance with an embodiment of the present disclosure.

Referring to FIG. 13, at step S1301, the memory controller may detect a low voltage or a low-voltage noise. Here, the low voltage may refer to a voltage when the power supply voltage to be applied to the memory controller or the memory device is reduced to a level lower than the reference level. The voltage noise may refer to a voltage when the power supply voltage to be applied to the memory controller or the memory device unevenly varies to a level higher than the reference level.

At step S1303, the memory controller may generate detect information. The detect information may be information indicating that the power supply voltage to be applied to the memory controller or the memory device has been reduced to a level equal to or lower than the reference level. The memory controller may perform an operation of resetting the power supply voltage to be applied to the memory device based on the detect information.

For example, at step S1305, the memory controller may suspend output of the command and data, and perform a backup operation. In an embodiment, the power supply voltage to be applied to the memory device becomes a level equal to or less than the reference level, whereby the operation that is performed by the memory device may be suspended. Since the operation that is performed by the memory device is suspended, i.e., since the memory device can no longer perform an operation, the memory controller may not output a command and data to the memory device.

Furthermore, the memory controller may back up a command and data that correspond to the suspended operation and a command and data that correspond to a request received from the host since the operation has been suspended. In other words, since the operation of the memory device has been suspended, a command and data that correspond to an operation to be performed on the memory device may be backed up. If the power supply voltage to be applied to the memory device becomes a normal level again, the backed-up command and data may be output to the memory device.

At step S1307, the memory controller may output a power supply voltage reset command to the memory device. The power supply voltage reset command may be a command for resetting the power supply voltage to be applied to the memory device. Based on the power supply voltage reset command, the memory device may reduce the power supply voltage to 0 V and then restore the power supply voltage to the normal level.

Figure 14:
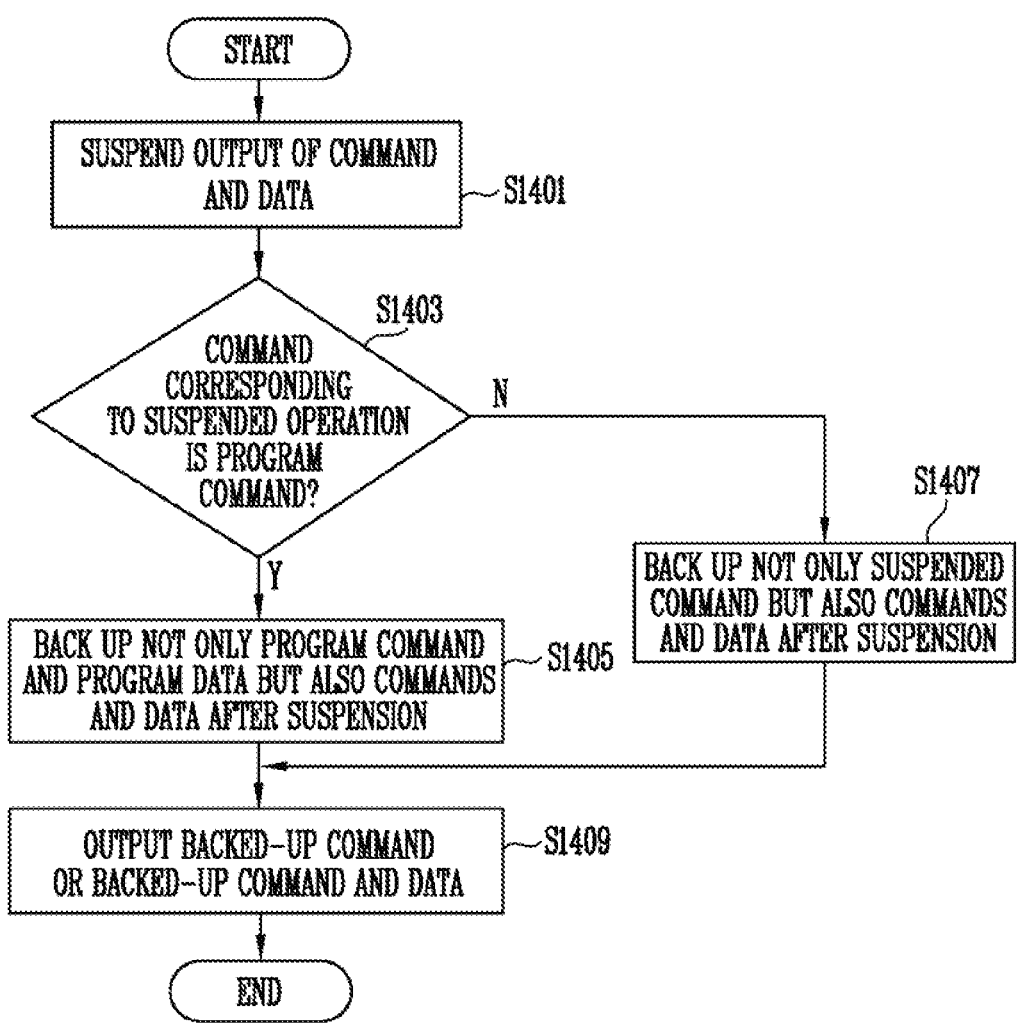
FIG. 14 is a diagram for describing an operation of the memory controller in accordance with an embodiment of the present disclosure.

FIG. 14 is a diagram for describing an operation of the memory controller in accordance with an embodiment of the present disclosure.

Referring to FIG. 14, at step S1401, the memory controller may suspend output of the command and data to the memory device. In other words, since the voltage to be applied to the memory controller or the memory device is equal to or less than the reference level, the memory controller may not output a command and data. Here, the memory device may suspend the operation that is being performed. In addition, the memory controller may perform an operation of backing up a command and data that correspond to the suspended operation and a command and data that correspond to a request received from the host since the operation has been suspended.

For example, at step S1403, the memory device may determine whether a command corresponding to the operation that has been being performed, i.e., a command corresponding to the suspended operation, is a program command.

If the command corresponding to the suspended operation is a program command, not only the program command but also program data corresponding to the program command is required to be backed up. Therefore, the program command corresponding to the suspended program operation, program data corresponding to the program command, and a command and data that correspond to a request received from the host after the suspended operation may be backed up (at step S1405).

If the command corresponding to the suspended operation is not a program command, i.e., if the command is a read command or an erase command, data is not required to be backed up. In other words, since data corresponding to the command is not present, the data is not required to be backed up. Therefore, a command and data that correspond to a request received from the host after the suspended operation may be backed up, including a read command or an erase command corresponding to the suspended read operation or the erased operation (at step S1407).

At step S1409, the memory controller may output the backed-up command or the back-up command and data to the memory device. In an embodiment, if the power supply voltage to be applied to the memory device is restored to the normal level again, the memory device becomes able to perform an operation. Hence, the memory controller may sequentially output the backed-up commands to the memory device. In other words, the memory controller may sequentially output commands to the memory device in a sequence from the command corresponding to the operation that has been suspended by the memory device. The memory device may perform operations in a sequence from the suspended operation.

Figure 15:
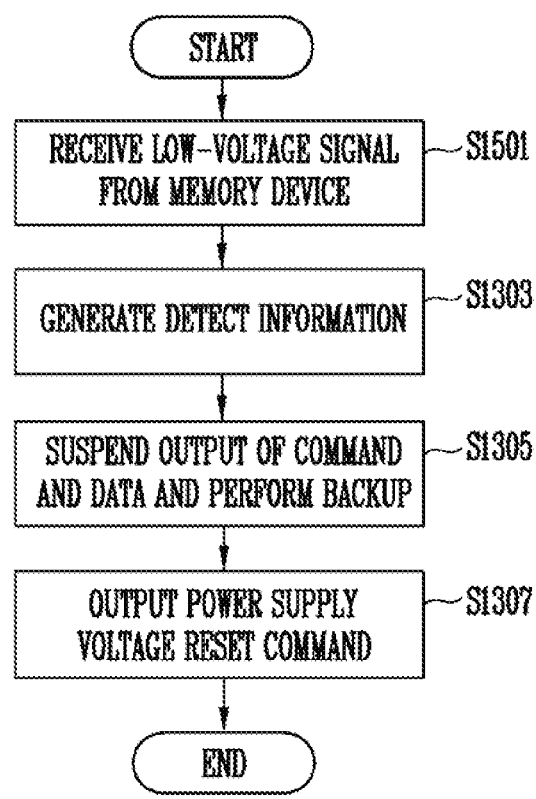
FIG. 15 is a diagram for describing an operation of the memory controller in accordance with an embodiment of the present disclosure.

FIG. 15 is a diagram for describing an operation of the memory controller in accordance with an embodiment of the present disclosure.

Referring to FIG. 15, at step S1501, the memory controller may receive a low-voltage signal. The low-voltage signal may be a signal indicating that the power supply voltage to be applied to the memory device has been equal to or less than the reference level. In other words, the memory controller may determine that the power supply voltage to be applied to the memory device has been equal to or less than the reference level based on the low-voltage signal.

Referring to FIGS. 13 and 15, if the power supply voltage to be applied to the memory device becomes equal to or less than the reference level, the memory controller may generate detect information (at step S1303). The memory controller may suspend output of the command and data based on the detect information (at step S1305). In other words, to prevent the memory device from malfunctioning while the memory device resets the power supply voltage, the memory controller may not output a command and data to the memory device.

Thereafter, based on the detect information, the memory controller may back up the command that is being performed by the memory device and the corresponding data, and a command and data that correspond to a request received from the host since then (at step S1305). If the power supply voltage to be applied to the memory device becomes a normal level again, the backed-up command and data may be output to the memory device.

If the backup data including commands and data is backed up to the memory controller, the memory controller may output a power supply voltage reset command (at step S1307). The power supply voltage reset command may be a command for resetting the power supply voltage to be applied to the memory device. Based on the power supply voltage reset command, the memory device may reduce the power supply voltage to 0 V and then restore the power supply voltage to the normal level.

Figure 16:
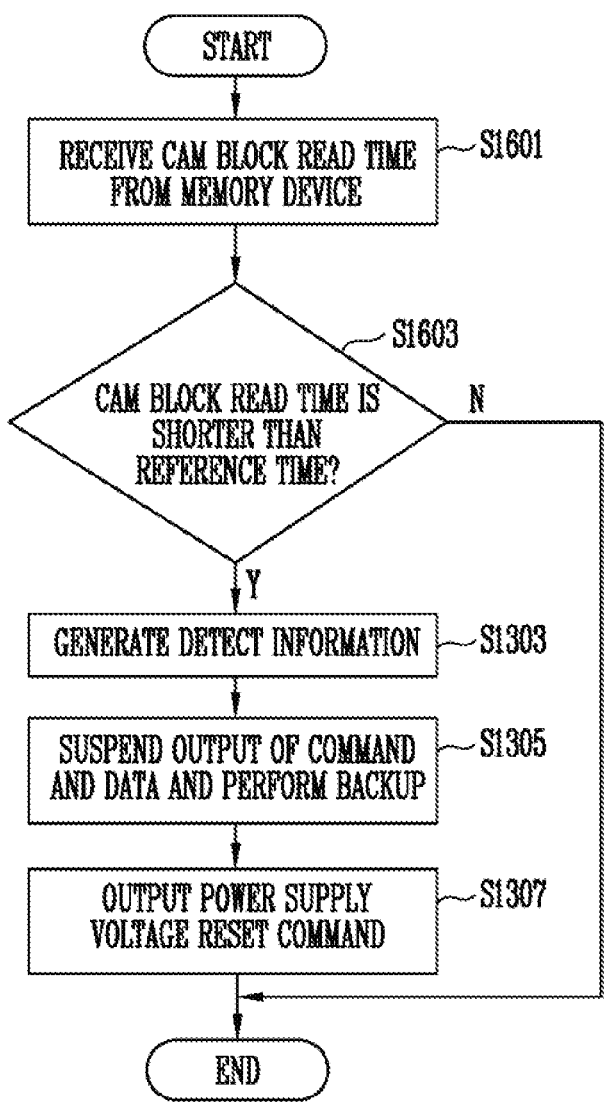
FIG. 16 is a diagram illustrating an operation of the memory controller in accordance with an embodiment of the present disclosure.

FIG. 16 is a diagram illustrating an operation of the memory controller in accordance with an embodiment of the present disclosure.

Referring to FIG. 16, at step S1601, the memory controller may receive a CAM block read time from the memory device. The CAM block read time may be the time it takes for the memory device to read data of a CAM block included in the memory cell array after having performed a booting operation.

At step S1603, it may be determined that the CAM block read time is shorter than a reference time.

In an embodiment, a predetermined amount of time may be required to read the data of the CAM block. If the time it takes to read the data of the CAM block is shorter than the reference time, some of the data of the CAM block may not be read. In other words, despite the fact that all of the data of the CAM block is required to be read so as to make it possible for the memory device to perform an operation, some of the data of the CAM block may not read. The fact that some of the data of the CAM block is not read may mean that the power supply voltage applied to the memory device is equal to or less than the reference level.

Consequentially, based on the CAM block read time, the memory controller may determine that the power supply voltage to be applied to the memory device is equal to or less than the reference level.

Referring to FIGS. 13 and 15, if the CAM block read time is shorter than the reference time, the memory controller may generate detect information (at step S1303). The memory controller may suspend output of the command and data based on the detect information (at step S1305). In other words, to prevent the memory device from malfunctioning while the memory device resets the power supply voltage, the memory controller may not output a command and data to the memory device.

Thereafter, based on the detect information, the memory controller may back up the command that is being performed by the memory device and the corresponding data, and a command and data that correspond to a request received from the host since then (at step S1305). If the power supply voltage to be applied to the memory device becomes a normal level again, the backed-up command and data may be output to the memory device.

If the backup data including commands and data is backed up to the memory controller, the memory controller may output a power supply voltage reset command (at step S1307). The power supply voltage reset command may be a command for resetting the power supply voltage to be applied to the memory device. Based on the power supply voltage reset command, the memory device may reduce the power supply voltage to 0 V and then restore the power supply voltage to the normal level.

Figure 17:
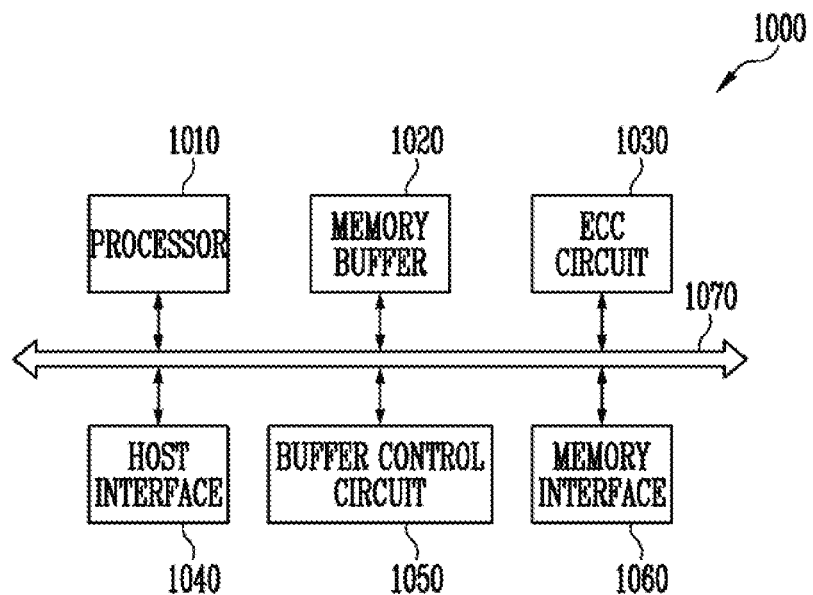
FIG. 17 is a diagram illustrating an embodiment of a memory controller of FIG. 1.

FIG. 17 is a diagram illustrating an embodiment of the memory controller of FIG. 1.

A memory controller 1000 is coupled to a host and a memory device. In response to a request from the host, the memory controller 1000 may access the memory device. For example, the memory controller 1000 may control a write operation, a read operation, an erase operation, and a background operation of the memory device. The memory controller 1000 may provide an interface between the memory device and the host. The memory controller 1000 may drive firmware for controlling the memory device.

Referring to FIG. 17, a memory controller 1000 may include a processor 1010, a memory buffer 1020, an error correction code (ECC) circuit 1030, a host Interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the external host through the host interface 1040, and communicate with the memory device through the memory interface 1060. In addition, the processor 1010 may communicate with the memory buffer 1020 through the buffer control circuit 1050. The processor 1010 may control the operation of the storage device by using the memory buffer 1020 as an operating memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA and translate the LBA into the PBA using a mapping table. An address mapping method using the FTL may be modified in various ways depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device as data to be stored, and may be programmed to the memory cell array.

The processor 1010 may detect that the level of the power supply voltage to be applied to the memory controller 1000 and the memory device (100 of FIG. 1) is equal to or less than the reference level. If the processor 1010 detects that the power supply voltage is equal to or less than the reference level, the processor 1010 may generate detect information. The processor 1010 may back up commands and data based on the detect information, and output a power supply voltage reset command for resetting the power supply voltage to be applied to the memory device.

The processor 1010 may drive software or firmware to perform the randomizing operation or the derandomizing operation.

The memory buffer 1020 may be used as an operating memory, a cache memory, or a buffer memory of the processor 1010. The memory buffer 1020 may store codes and commands to be executed by the processor 1010. The memory buffer 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be included in the memory interface 1060 as a component of the memory interface 1060.

The host interface 1040 may communicate with the external host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multi-media card (MMC), an embedded MMC (eMMC), a dual in-line memory module (DIMM), a registered DIMM (RDIMM), and a load reduced DIMM (LRDIMM) communication methods.

The buffer control circuit 1050 may control the memory buffer 1020 under control of the processor 1010.

The memory interface 1060 may communicate with the memory device 100 under control of the processor 1010. The memory interface 1060 may communicate a command, an address, and data with the memory device through the channel.

For example, the memory controller 1000 may include neither the memory buffer 1020 nor the buffer control circuit 1050.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and may neither interfere with each other nor affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 18:
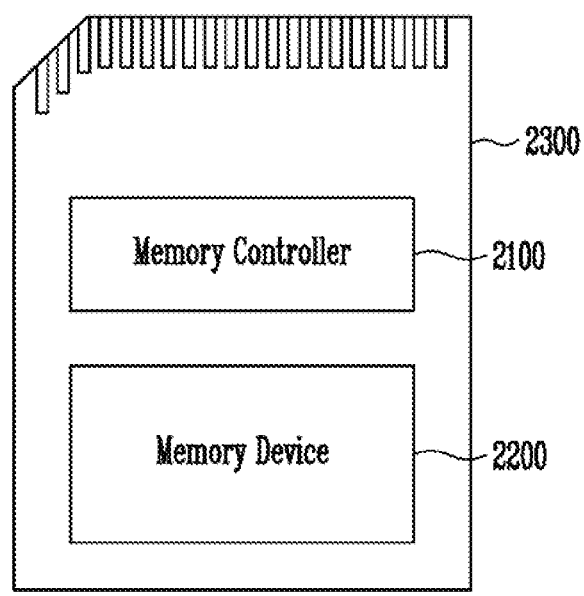
FIG. 18 is a block diagram illustrating a memory card system to which the storage device in accordance with an embodiment of the present disclosure is applied.

FIG. 18 is a block diagram illustrating a memory card system to which the storage device in accordance with an embodiment of the present disclosure is applied.

Referring FIG. 18, the memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2100 and the host. The memory controller 2100 may drive firmware for controlling the memory device 2200. The memory device 2200 may be embodied in the same manner as that of the memory device 100 described with reference to FIG. 9.

The memory controller 210 may detect that the level of the power supply voltage to be applied to the memory controller 2100 and the memory device (100 of FIG. 1) is equal to or less than the reference level. If the memory controller 2100 detects a power supply voltage equal to or less than the reference level, the memory controller 210 may generate detect information. The memory controller 2100 may back up commands and data based on the detect information, and output a power supply voltage reset command for resetting the power supply voltage to be applied to the memory device.

In an embodiment, the memory controller 2100 may include components such as a random access memory (RAM), a processing unit, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory controller 2100 and the memory device 2200 may be integrated into a single semiconductor device to form a memory card. For example, the memory controller 2100 and the memory device 2200 may be integrated into a single semiconductor device to form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

Figure 19:
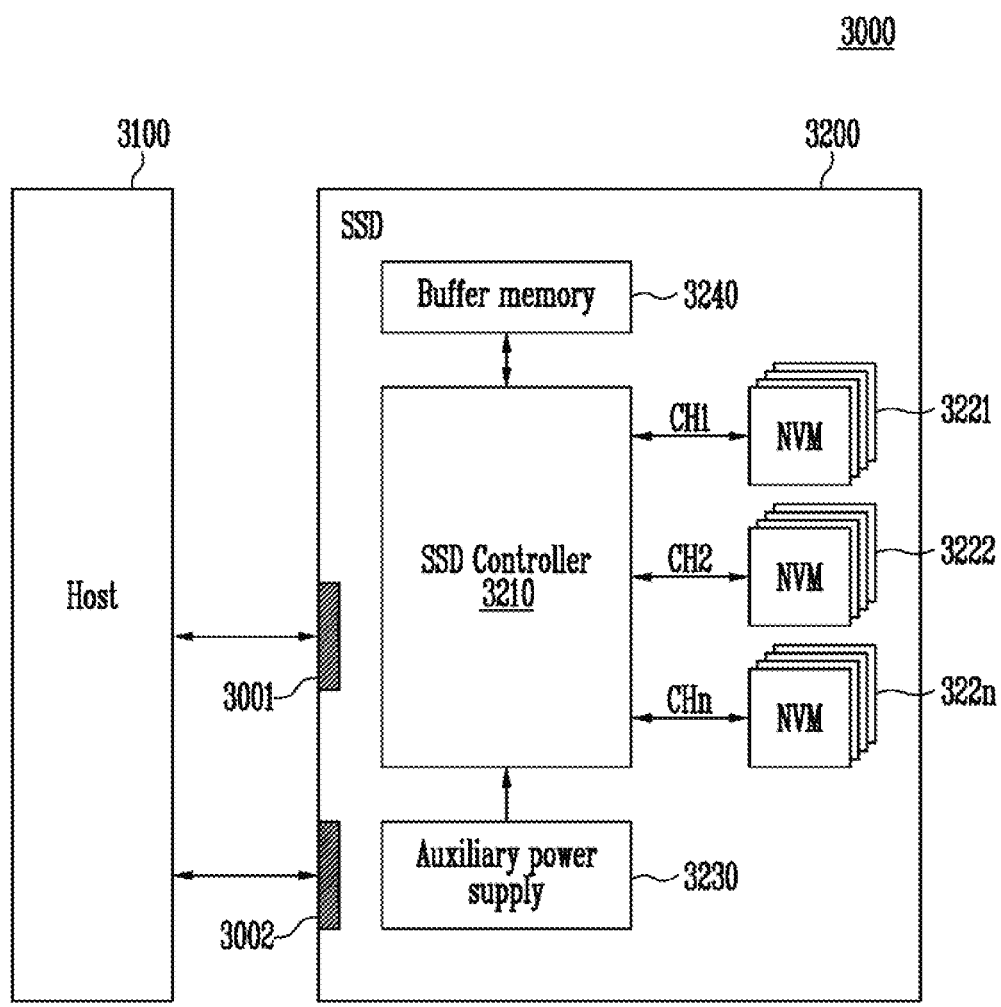
FIG. 19 is a block diagram illustrating a solid state drive (SSD) system to which the storage device in accordance with an embodiment of the present disclosure is applied.

FIG. 19 is a block diagram illustrating a solid state drive (SSD) system to which the storage device in accordance with an embodiment of the present disclosure is applied.

Referring to FIG. 19, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be signals based on an interface between the host 3100 and the SSD 3200. For example, the signals SIG may be signals defined by at least one of various interfaces such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The SSD controller 3210 may detect that the level of the power supply voltage to be applied to the SSD 3200 is equal to or less than the reference level. If the memory controller 3210 detects a power supply voltage equal to or less than the reference level, the memory controller 210 may generate detect information. The SSD controller 3210 may back up commands and data based on the detect information, and output a power supply voltage reset command for resetting the power supply voltage to be applied to the plurality of flash memories 3221 to 322n.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., a mapping table) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 20:
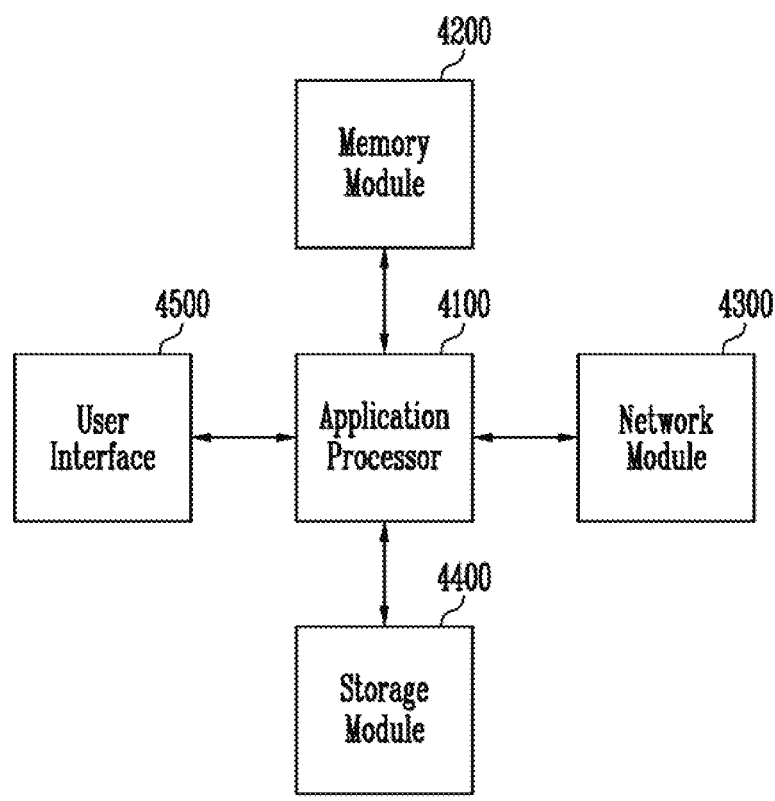
FIG. 20 is a block diagram illustrating a user system to which the storage device in accordance with an embodiment of the present disclosure is applied.

FIG. 20 is a block diagram illustrating a user system to which the storage device in accordance with an embodiment of the present disclosure is applied.

Referring to FIG. 20, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The application processor 4100 may detect that the level of the power supply voltage to be applied to the user system 4000 is equal to or less than the reference level. If the application processor 4100 detects that the power supply voltage is equal to or less than the reference level, the application processor 4100 may generate detect information. The application processor 4100 may back up commands and data based on the detect information, and output a power supply voltage reset command for resetting the power supply voltage to be applied to the user system 4000.

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or WI-FI communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be operated in the same manner as that of the memory device 100, described above with reference to FIGS. 9 to 12. The storage module 4400 may be operated in the same manner as that of the storage device 50 described above with reference to FIG. 1.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as an a Liquid Crystal Display (LCD), an Organic Light Emitting Diode (OLED) display device, an Active Matrix OLED (AMOLED) display device, an LED, a speaker, a monitor, and so on.

Various embodiments of the present disclosure may provide a memory controller configured to control reset of a power supply voltage, and a method of operating the memory controller.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not be always performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the concepts described herein will still fall within the spirit and scope of the present disclosure as defined in the appended claims and their equivalents.

What is claimed is:

1. A memory controller configured to control a memory device for storing data, the memory controller comprising:
    a data transmitter configured to receive a request and data from a host, and output the data and a command corresponding to the request to the memory device;
    a voltage sensor configured to detect whether a level of a power supply voltage to be applied to the memory device and the memory controller is equal to or less than a reference level, and generate detect information;
    a data backup component configured to store backup data based on the detect information; and
    a power supply controller configured to output, to the memory device, a power supply voltage reset command for resetting the power supply voltage to be applied to the memory device based on the detect information,
    wherein the reference level is greater than the voltage level for initiating reset of the memory device and the memory controller and less than the voltage level required for the memory device and the memory controller to perform an operation.

2. The memory controller according to claim 1, wherein the reference level is a voltage level before the memory device autonomously starts an operation of resetting the power supply voltage.

3. The memory controller according to claim 1, wherein, when the detect information is received, the data transmitter suspends the output of the data and the command corresponding to the request.

4. The memory controller according to claim 1, wherein the backup data includes a command corresponding to an operation that is performed by the memory device before the power supply voltage is reset.

5. The memory controller according to claim 4, wherein, when the operation that is performed by the memory device is a program operation, the backup data includes program data corresponding to the program operation.

6. The memory controller according to claim 1, wherein the backup data includes data and a command corresponding to a request received from the host after the data transmitter receives the detect information.

7. The memory controller according to claim 1, wherein the voltage sensor generates the detect information when the power supply voltage repeatedly shifts between a level lower than the reference level and a level higher than the reference level and wherein the repeatedly shifts mean that the power supply voltage may be higher than the reference level and then lower than the reference level, and repeated.

8. The memory controller according to claim 1, wherein the voltage sensor generates the detect information when the voltage sensor receives a low-voltage signal indicating that the level of the power supply voltage to be applied to the memory device is equal to or less than the reference level.

9. The memory controller according to claim 1, wherein the voltage sensor generates the detect information when a CAM block read time received from the memory device is shorter than a reference time.

10. The memory controller according to claim 1, wherein, when the power supply voltage applied to the memory device is reset, a command and data that have been backed up to the data backup component are output to the data transmitter.

11. The memory controller according to claim 10, wherein the data transmitter outputs the backed-up command and data to the memory device.

12. A method of operating a memory controller configured to control a memory device for storing data, the method comprising:
    receiving a request and data from a host, and outputting the data and a command corresponding to the request to the memory device;
    detecting whether a level of a power supply voltage to be applied to the memory device and the memory controller is equal to or less than a reference level, and generating detect information;
    storing backup data based on the detect information; and
    outputting, to the memory device, a power supply voltage reset command for resetting the power supply voltage to be applied to the memory device based on the detect information,
    wherein the reference level is greater than the voltage level for initiating reset of the memory device and the memory controller and less than the voltage level required for the memory device and the memory controller to perform an operation.

13. The method according to claim 12, wherein the reference level is a voltage level before the memory device autonomously starts an operation of resetting the power supply voltage.

14. The method according to claim 12, further comprising suspending, when the detect information is generated, the output of the data and the command corresponding to the request.

15. The method according to claim 12, wherein the storing of the backup data comprises:
  storing, when an operation that is performed by the memory device before the power supply voltage is reset is a program operation, a program command corresponding to the program operation and program data corresponding to the program command; and
  storing, when the operation that is performed by the memory device is an operation other than the program operation, a command corresponding to the operation other than the program operation.

16. The method according to claim 12, wherein the storing of the backup data comprises storing data and a command corresponding to a request received from the host after the detect information is received.

17. The method according to claim 12, wherein the generating of the detect information comprises generating the detect information when the power supply voltage repeatedly shifts between a level lower than the reference level and a level higher than the reference level and wherein the repeatedly shifts mean that the power supply voltage may be higher than the reference level and then lower than the reference level, and repeated.

18. The method according to claim 12, wherein the generating of the detect information comprises generating the detect information when a CAM block read time received from the memory device is shorter than a reference time.

19. The method according to claim 12, further comprising outputting the backup data to the memory device when the power supply voltage to be applied to the memory device has been reset.

20. A memory controller configured to control a memory device for storing data, the memory controller comprising:
  a voltage sensor configured to detect when a level of a power supply voltage to be applied to the memory device is equal to or less than a reference level and generate detect information; and
  a power controller configured to receive the detect information and output, to the memory device, a power supply voltage reset command for resetting the power supply voltage to be applied to the memory device,
  wherein the reference level is greater than the voltage level for initiating reset of the memory device and the memory controller and less than the voltage level required for the memory device and the memory controller to perform an operation.

* * * * *